(12) United States Patent
Shimada et al.

(10) Patent No.: US 6,757,580 B2
(45) Date of Patent: Jun. 29, 2004

(54) SEMICONDUCTOR MANUFACTURING LINE MONITORING SYSTEM

(75) Inventors: Toyoharu Shimada, Hyogo (JP); Kazuo Kanai, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/390,918

(22) Filed: Mar. 19, 2003

(65) Prior Publication Data

US 2004/0073327 A1 Apr. 15, 2004

(30) Foreign Application Priority Data

Oct. 9, 2002 (JP) ........................................ 2002-296499

(51) Int. Cl.⁷ .............................................. G06F 19/00
(52) U.S. Cl. ..................... 700/108; 700/109; 700/110; 700/121; 700/100
(58) Field of Search ................................ 700/108, 109, 700/110, 121, 100

(56) References Cited

U.S. PATENT DOCUMENTS 5,442,561 A * 8/1995 Yoshizawa et al. ......... 700/100
5,854,994 A * 12/1998 Canada et al. .............. 700/108
2002/0077711 A1 * 6/2002 Nixon et al. ................. 700/51
2002/0116083 A1 * 8/2002 Schulze ..................... 700/108

FOREIGN PATENT DOCUMENTS

| JP | 6-266634 | 9/1994 |
| JP | 8-055086 | 2/1996 |
| JP | 10-55291 | 2/1998 |
| JP | 11-345213 | 12/1999 |
| JP | 2000-99542 | 4/2000 |

* cited by examiner

Primary Examiner—Leo Picard
Assistant Examiner—Charlie Kasenge
(74) Attorney, Agent, or Firm—Leydig, Voit & Mayer, Ltd.

(57) ABSTRACT

A monitoring system includes a factory automation (FA) computer for receiving information from a manufacturing apparatus, an information collecting computer for receiving the information on a LAN from the FA computer and sending the received information to a facility operation monitoring host computer, and the facility operation monitoring host computer constructs a database based on the received information and displaying the information for a supervisor in accordance with the constructed database. The facility operation monitoring host computer includes databases, and displays information stored in the databases on a monitor, linking the information from the databases.

20 Claims, 43 Drawing Sheets

F I G. 4

| CONTROL NO. | BUILDING NO. | FLOOR NO. | AREA NO. | APPARATUS NO. (ID) | APPARATUS NAME | APPARATUS FUNCTION |
|---|---|---|---|---|---|---|
| 10384132 | DK | 1F | SPX | 102 | VACUUM PLATING | FULL FA |
| ⋮ | ⋮ | ⋮ | ⋮ | ⋮ | ⋮ | ⋮ |

F I G. 5

| CONTROL NO. | FIRST RECEIVE STATUS | | SECOND RECEIVE STATUS | | ... | NTH RECEIVE STATUS | | CURRENT STATUS | CURRENT APPARATUS MODE | LIST OF LOTS IN PROCESS | LIST OF LOTS UNDER WAITING |
|---|---|---|---|---|---|---|---|---|---|---|---|
| | STATUS | RECEIVE DATE/TIME | STATUS | RECEIVE DATE/TIME | ... | STATUS | RECEIVE DATE/TIME | | | | |
| 67432982 | OPERATING | 20020902 10:00 | WAITING | 20020902 09:10 | ... | ... | ... | OPERATING | FULL AUTOMATIC | LU08800 ... | L70690S ... |

F I G. 6

| BUILDING NO. | FLOOR NO. | AREA NO. | COMPILATION OF STATUS (NUMBERS OF APPARATUSES) | | | | | BUILDING INFORMATION |
|---|---|---|---|---|---|---|---|---|
| | | | OPERATING | WAITING | FAILURE | SCHEDULED MAINTENANCE | SCHEDULED STOP | |
| DK01 | 1F | SPX | | | | | | |
| | | ... | | | | | | |
| | 2F | SPX | | | | | | |
| | | ... | | | | | | |
| | ... | | | | | | | |

F I G. 7

| BUILDING NO. | FLOOR NO. | AREA NO. | COMPILATION OF STATUS (CONTROL NO.) | | | | | FLOOR INFORMATION |
|---|---|---|---|---|---|---|---|---|
| | | | OPERATING | WAITING | FAILURE | SCHEDULED MAINTENANCE | SCHEDULED STOP | |
| DK01 | 1F | SPX | 6216841.1213234 | ... | | | | |
| | | ... | | | | | | |
| | 2F | SPX | | | | | | |
| | | ... | ... | | | | | |

FIG. 8

| BUILDING NO. | FLOOR NO. | AREA NO. | CONTROL NO. | STATUS | APPARATUS FUNCTION | NUMBER OF LOTS IN PROCESS | NUMBER OF LOTS UNDER WAITING |
|---|---|---|---|---|---|---|---|
| DK01 | 1F | SPX | | | | | |
| | | ... | | | | | |
| | 2F | SPX | | | | | |
| | | ... | | | | | |
| | ... | | | | | | |

FIG. 9

| LOT CONTROL NO. | STEP | MANUFACTURING METHOD | NUMBER OF PROCESSED ITEMS | NUMBER OF LOTS |
|---|---|---|---|---|
| ⋮ | ⋮ | ⋮ | ⋮ | ⋮ |
| | | | | |
| | | | | |
| | | | | |
| | | | | |
| | | | | |
| | | | | |
| | | | | |
| | | | | |

FIG. 10

| LOT CONTROL NO. | QUALITY HISTORY | QUALITY TROUBLE | FAULTY STEP | CONTROL NO. OF FAULTY APPARATUS | TROUBLE INFORMATION |
|---|---|---|---|---|---|
| ... | ... | ... | ... | ... | |
| | | | | | |
| | | | | | |
| | | | | | |
| | | | | | |
| | | | | | |
| | | | | | |

FIG. 11

| CONTROL NO. | ERROR CODE | ERROR NAME | OPERATOR | FAILURE FACTOR | FAILURE CAUSE | ... | ALARMING FLAG | ALARM INFORMATION |
|---|---|---|---|---|---|---|---|---|
| 6743276 | ... | ... | ... | ... | ... | ... | ... | ... |
| | | | | | | | | |
| | | | | | | | | |
| | | | | | | | | |
| | | | | | | | | |

FIG. 12

| CONTROL NO. | COMPILATION OF OPERATIONS (2002/09/01) | | | | | COMPILATION OF RESULTS (2002/09/01) | | | COMPILATION OF OPERATIONS (2002/08/31) | COMPILATION OF RESULTS (2002/08/31) |
|---|---|---|---|---|---|---|---|---|---|---|
| | OPERATION TIME | WAITING TIME | FAILURE TIME | SCHEDULED MAINTENANCE TIME | SCHEDULED STOP TIME | TIME ZONE | OUTPUT | IN PROCESS | ... | ... |
| 6743276 | 00:50~01:45 | 01:45~02:45 | 06:30~11:00 | | | ~01:00 | 212 | 2618 | ... | ... |
| | 02:45~06:30 | | | | | ~02:00 | | | | |
| | 11:00~16:30 | | | | | ~03:00 | | | | |
| | | | | | | ~04:00 | | | | |
| | | | | | | ... | | | | |
| | | | | | | ~23:00 | | | | |
| | | | | | | ~24:00 | | | | |

F I G. 13

| CONTROL NO. | COMPILATION OF OPERATIONS (2002/09/01) | | | | | COMPILATION OF RESULTS (2002/09/01) | | | COMPILATION OF OPERATIONS (2002/08/31) | COMPILATION OF RESULTS (2002/08/31) |
|---|---|---|---|---|---|---|---|---|---|---|
| | TOTAL OPERATION TIME | TOTAL WAITING TIME | TOTAL FAILURE TIME | TOTAL SCHEDULED MAINTENANCE TIME | TOTAL SCHEDULED STOP TIME | | OUTPUT | IN PROCESS | | |
| | | | | | | NIGHT SHIFT | ... | ... | ... | ... |
| | | | | | | EARLY SHIFT | ... | ... | | |
| 6743276 | ... | ... | ... | ... | ... | LATE SHIFT | ... | ... | ... | ... |
| | | | | | | | | | | |
| | | | | | | | | | | |

FIG. 14

| CONTROL NO. | COMPILATION OF OPERATIONS (~2002/09/01) ||||| COMPILATION OF RESULTS (~2002/09/01) |||| COMPILATION OF OPERATIONS (~2002/08/25) || COMPILATION OF RESULTS (~2002/08/25) ||
|---|---|---|---|---|---|---|---|---|---|---|---|---|---|
| | TOTAL OPERATION TIME | TOTAL WAITING TIME | TOTAL FAILURE TIME | TOTAL SCHEDULED MAINTENANCE TIME | TOTAL SCHEDULED STOP TIME | OUTPUT | NIGHT SHIFT | EARLY SHIFT | LATE SHIFT | | | | |
| 6743276 | ... | ... | ... | ... | ... | | ... | ... | ... | ... | ... | ... | ... |
| | | | | | | | | | | | | | |
| | | | | | | | | | | | | | |
| | | | | | | | | | | | | | |

FIG. 15

| CONTROL NO. | COMPILATION OF OPERATIONS (2002/08) ||||| COMPILATION OF RESULTS (2002/08) ||||| COMPILATION OF OPERATIONS (2002/07) | COMPILATION OF RESULTS (2002/07) | ... |
|---|---|---|---|---|---|---|---|---|---|---|---|---|---|
| | TOTAL OPERATION TIME | TOTAL WAITING TIME | TOTAL FAILURE TIME | TOTAL SCHEDULED MAINTENANCE TIME | TOTAL SCHEDULED STOP TIME | OUTPUT | | NIGHT SHIFT | EARLY SHIFT | LATE SHIFT | | | |
| 6743276 | ... | ... | ... | ... | ... | | | ... | ... | ... | ... | ... | ... |
| | | | | | | | | | | | | | |
| | | | | | | | | | | | | | |

FIG. 16

| | CONTROL NO. | ERROR CODE | ERROR NAME | FAULTY STEP | TIME OF FAILURE OCCURRENCE | ... | ALARMING TIME | ALARM INFORMATION | ... | | | |
|---|---|---|---|---|---|---|---|---|---|---|---|---|
| APPARATUS FAILURE | 6743276 | ... | | | | | | ... | | | | |
| | | | | | | | | | | | | |
| | | | | | | | | | | | | |
| | LOT CONTROL NO. | QUALITY TROUBLE CODE | QUALITY TROUBLE NAME | FAULTY STEP | FAULTY CONTROL NO. | ... | ALARMING TIME | ALARM INFORMATION | ... | | | |
| QUALITY ABNORMALITY | ... | | | | | | | ... | | | | |
| | | | | | | | | | | | | |
| | | | | | | | | | | | | |

F I G. 17

| CONTROL NO. | PLANNED OUTPUT ||||||||
|---|---|---|---|---|---|---|---|---|
| | 2002 09/09 | 2002 09/08 | 2002 09/07 | 2002 09/06 | 2002 09/05 | 2002 09/04 | 2002 09/03 | 2002 09/02 |
| 6743276 | ... | ... | ... | ... | ... | ... | ... | ... |
| | | | | | | | | |
| | | | | | | | | |
| | | | | | | | | |

F I G. 18

| MAINTENANCE CODE | ITEM NAME | INTERVAL | UNIT |
|---|---|---|---|
| 01 | ... | ... | ... |
| | | | |
| | | | |

F I G. 19

| CONTROL NO. | MAINTENANCE CODE | CURRENT INTERVAL | EXECUTION DATE | SCHEDULED DATE | ALARM DATE | SCHEDULE CHANGE | DELAY | OPERATION CONTENT DATA |
|---|---|---|---|---|---|---|---|---|
| 6743276 | ... | ... | ... | ... | ... | ... | ... | |
| | | | | | | | | |
| | | | | | | | | |
| | | | | | | | | |

F I G. 30

APPARATUS STATUS DISPLAY FUNCTION < DK BLDG. < 1F < UPX AREA < UPX105 < CURRENT STATUS 2002/09/02 15:05:30

UPX105 STATUS MONITOR

APPARATUS ID     : UPX 105
APPARATUS NAME   : VACUUM PLATING PROCESSING
APPARATUS MODE   : FULL AUTOMATIC MODE
APPARATUS STATUS : OPERATING - MASS PRODUCTION

| NO. | LOT ID   | STATUS     |
|-----|----------|------------|
| 01  | LU08800  | PROCESSING |
| 02  | LT88400  | PROCESSING |
| 03  | LU17700  | PROCESSING |
| 04  | LT94500  | PROCESSING |
| 05  | L70690S  | WAITING    |
| 06  | L74730S  | WAITING    |
| 07  | L76250S  | WAITING    |
| 08  | L75830S  | WAITING    |

TOTAL LOT NUMBER: 11

STATISTICS FUNCTION          RETURN

FIG. 31

STATISTICS FUNCTION < DK BLDG. < 1F < UPX AREA << STATUS HISTORY          2002/09/02 15:05:30

STATUS HISTORY

DK BLDG. 1F UPX SYSTEM                                    2002/09/01

| APPARATUS ID | TIME | | | |
|---|---|---|---|---|
| UPX102 | A | B | A | C | A |
| UPX103 | A | C | B | A | |
| UPX104 | A | C | A | | |
| UPX105 | A | E | A | | |

A  OPERATING
B  WAITING
C  FAILURE
D  PERIODICAL MAINTENANCE
E  SCHEDULED STOP

RETURN

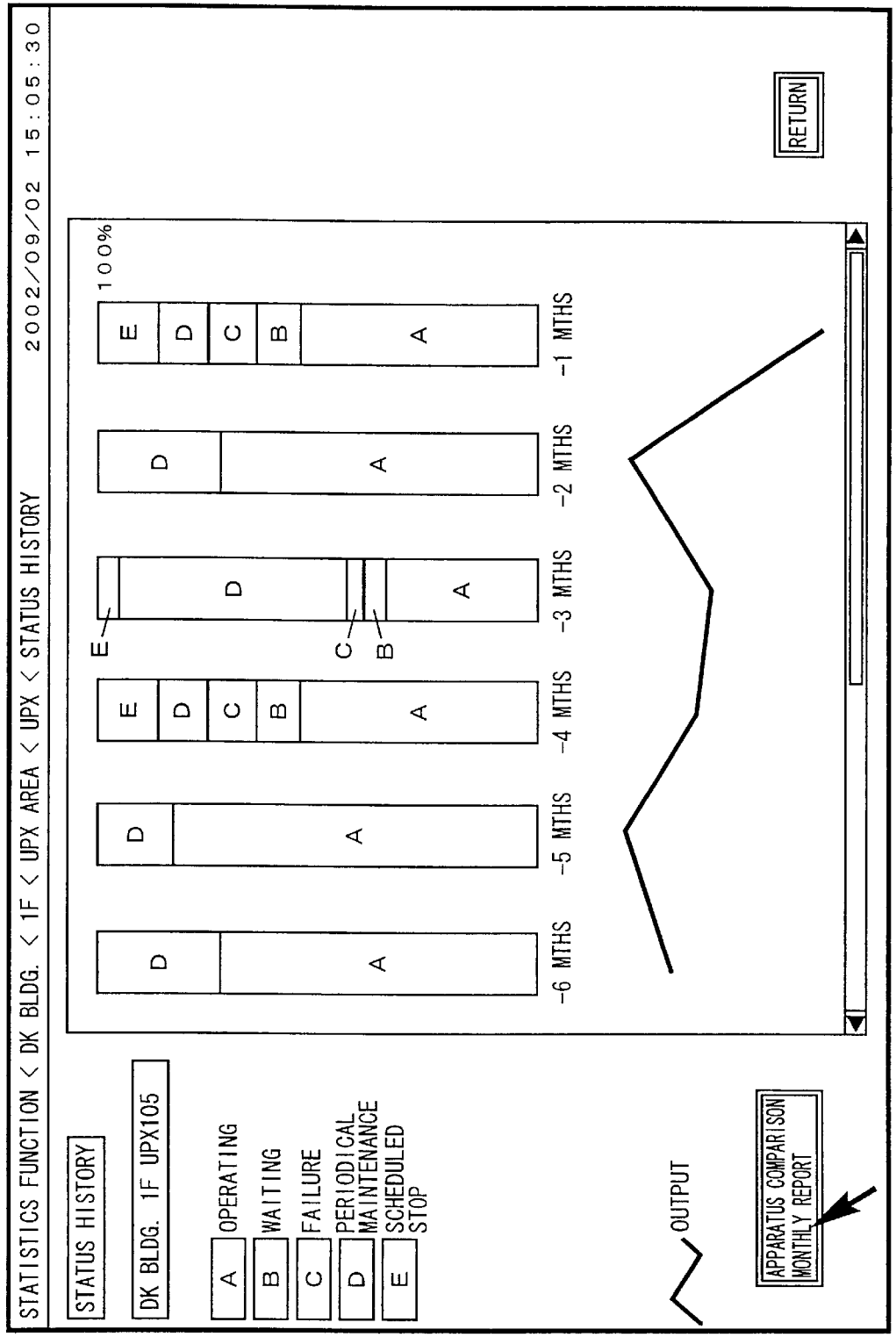
F I G. 36

FIG. 38

STATISTICS FUNCTION < DK BLDG. < 1F < UPX AREA < UPX < STATUS HISTORY          2002/09/02 15:05:30

STATUS HISTORY

DK BLDG. 1F UPX SYSTEM

| A | OPERATING |
| B | WAITING |
| C | FAILURE |
| D | PERIODICAL MAINTENANCE |
| E | SCHEDULED STOP |

2002/08
2002/07
2002/06

APPARATUS ID                                          100% OUTPUT

| UPX102 | A | B | C | D | E | 378137 |
| UPX103 | A | B | C | D | E | 288111 |
| UPX104 | A | B | C D | E | | 363272 |
| UPX105 | A | B | C | D | E | 223272 |

RETURN

FIG. 40

PERIODICAL MAINTENANCE CONTROL FUNCTION << PERIODICAL MAINTENANCE SCHEDULE DISPLAY   2002/09/02  15:05:30

PERIODICAL MAINTENANCE SCHEDULE   2002/09/01~2002/09/30

DK BLDG.  1F UPX SYSTEM

- ● RESULTS : DOUBLE-CLICK FOR DISPLAYING PERIODICAL MAINTENANCE RESULTS
- ○ SCHEDULED DATE: DOUBLE-CLICK 1ST SCHEDULED DATE FOR DISPLAYING DATE CHANGE SCREEN
- △ ALARM : DOUBLE-CLICK FOR DISPLAYING DATE CHANGE SCREEN
- □ DATE CHANGE : DOUBLE-CLICK FOR DISPLAYING DATE CHANGE SCREEN
- ▲ MAINTENANCE DELAY

| APPARATUS ID | MAINTENANCE CODE | ITEM NAME | INTERVAL STANDARD | INTERVAL CURRENT | UNITS | 9/1 (SUN) | 9/2 (MON) | 9/3 (TUE) | 9/4 (WED) |
|---|---|---|---|---|---|---|---|---|---|
| | | TOTAL DISPLAY ●○ ▲□ | | | | ●○ ▲ | ●○ ▲ | ○ ▲ | ○ ▲ |
| UPX102 | 01 | 20HR CLEANING | 20 | 54 | HOURS | ●● | | | |
| UPX103 | 06 | 120HR CLEANING | 120 | 0 | HOURS | ○ | | | |
| UPX104 | 07 | 300HR CLEANING | 300 | 487 | HOURS | | | | |
| UPX105 | 03 | 40HR CLEANING | 40 | 33 | HOURS | | | | |
| UPX106 | 01 | 20HR CLEANING | 20 | 12 | HOURS | | ○ | ○ | |
| UPX107 | 02 | 30HR CLEANING | 30 | 422 | HOURS | | ▲ | | |
| UPX108 | 06 | 120HR CLEANING | 120 | 295 | HOURS | | | | |

RETURN

FIG. 41

PERIODICAL MAINTENANCE CONTROL FUNCTION << PERIODICAL MAINTENANCE RESULT DISPLAY   2002/09/02   15:05:30

PERIODICAL MAINTENANCE RESULTS   2002/09/01~2002/09/30

DK BLDG. 1F UPX102

[RETURN]

| | | |
|---|---|---|
| APPARATUS STOP TIME | 2002/09/01 14:34 | |
| OPERATION START TIME | 2002/09/01 14:30 | |
| AREA | UPX   APPARATUS ID   UPX102 | |

DELAY FACTOR

PERIODICAL MAINTENANCE NAME (1)   120HR CLEANING
PERIODICAL MAINTENANCE NAME (2)   20HR CLEANING
PERIODICAL MAINTENANCE NAME (3)
PERIODICAL MAINTENANCE NAME (4)
PERIODICAL MAINTENANCE NAME (5)

MEMO

MAINTENANCE TYPES
● ORDINARY MAINTENANCE   ○ CHANCE MAINTENANCE   ○ MAINTENANCE AFTER TROUBLE

| | OPERATOR ID | OPERATOR | | DATA | | OPERATION END TIME |
|---|---|---|---|---|---|---|
| OPERATION TIME | 6777278 | ##### | 1 0000005 | 4 0000003 | | 2002/09/01 16:30 |
| MAINTENANCE SECTION | 0.002 Hr | | 2 0000000 | 5 0000001 | | STABILIZING TIME  002.0 Hr |
| MANUFACTURING SECTION | Hr | | 3 | 6 | | CF TIME  004.0 Hr |
| OUTSIDE AGENCY | Hr | | | | | |

F I G. 4 2

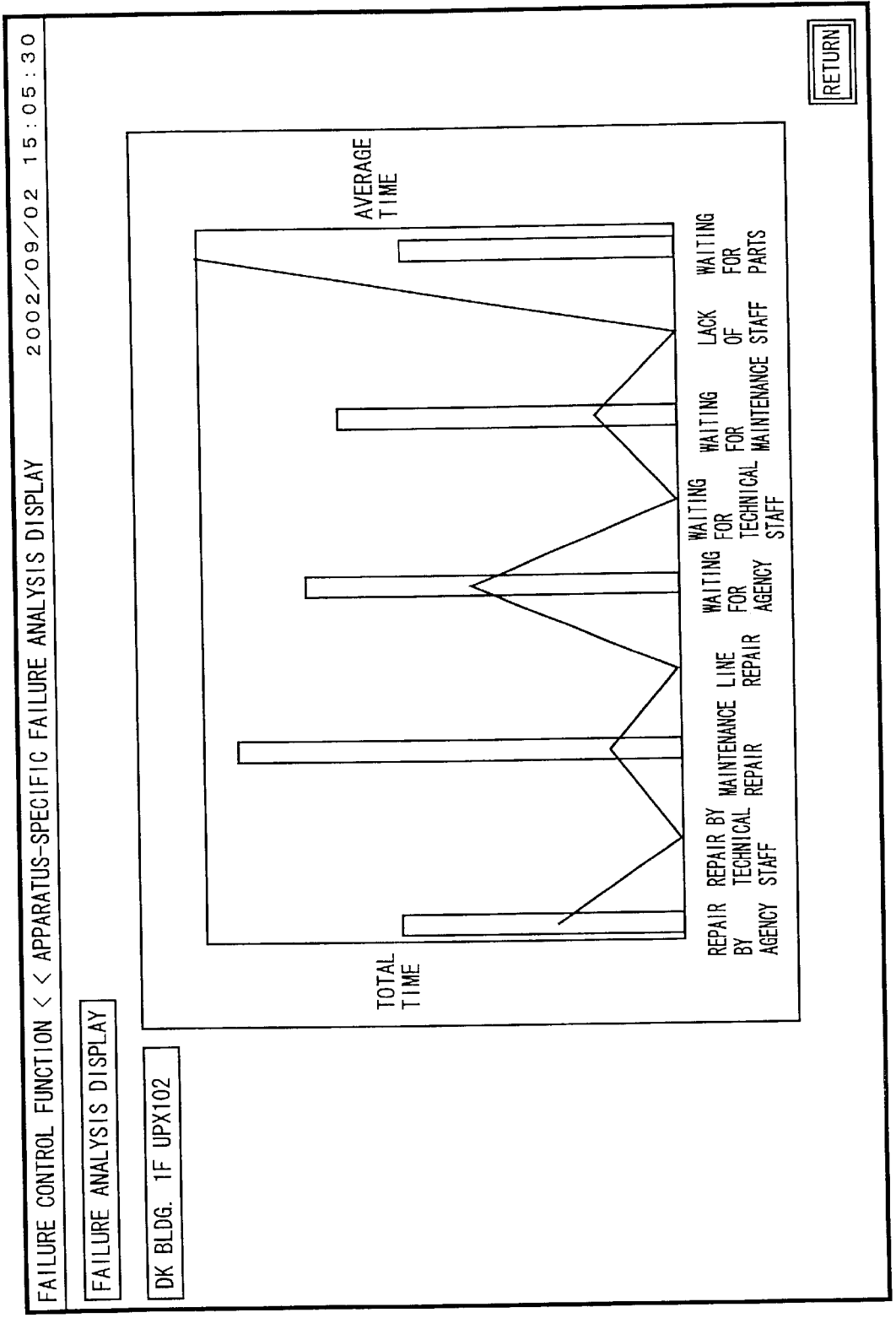

SEMICONDUCTOR MANUFACTURING LINE MONITORING SYSTEM

BACKGROUND OF THE INVENTION

1. Field of the Invention

The present invention relates to a system for monitoring apparatuses in a production factory including many manufacturing apparatuses, and particularly relates to a system for monitoring operation statuses of the manufacturing apparatuses and/or for monitoring qualities of products manufactured by the manufacturing apparatuses.

2. Description of the Background Art

In a production factory for manufacturing semiconductor chips, structures of products have been combined and integrated to a higher extent in accordance with integration of the semiconductor chips, and improvement of functions. For such combination and integration, a process for producing such products are divided into many steps, in which manufacturing apparatuses are arranged and operated to produce the products. In such a production factory, it is necessary to monitor the steps for improving the manufacturing efficiency, and enhancing the quality control. Many systems have been available for executing such monitoring and controlling the steps.

Japanese Patent Laying-Open No. 8-55086 has disclosed a graphics display system aimed at fast operation of a monitor system, sharing of information and improvement in expandability. This system displays information relating to a plant on a monitor for executing the monitoring and control of the plant. This system includes an online server for controlling online information such as a status of the plant, an facility server for controlling information relating to facilities such as types and arrangements of plant facilities, a graphics server for controlling graphics information such as symbols and color definitions for displaying the statuses of plant and facilities in graphics, and a graphics server for integrating data controlled by the respective database servers into a single kind of information.

According to this system, databases and processing functions can be distributed, and the databases can be object-oriented. Further, the graphics server can achieve unified operation of the databases. Therefore, high-speed technology of the database can be fully used, and transparency of the data can be achieved. Consequently, fast processing and effective use of computer resources can be achieved, and expandability of the system, sharing of the information and improvement of the reliability can be achieved.

Japanese Patent Laying-Open No. 10-55291 has disclosed a maintenance system, which allows easy input and renewal of maintenance information of a plant, and is connected to maintenance-target facilities in all the world. This system is formed of the maintenance-target devices and a WWW server. The maintenance-target facilities include an intelligent alarm circuit for performing self-diagnostics, a message preparing circuit for producing a message based on results of the self-diagnostics by the intelligent alarm circuit, and a message sending circuit for sending the message thus prepared on the Internet. The WWW server includes a message receiving circuit for receiving the message sent from the maintenance-target facilities, a message decoding circuit for decoding the received message, a message processing circuit for processing the decoded message, and an information storing circuit for storing information required for the maintenance of the maintenance-target facilities. In this system, the WWW server calls out a maintenance terminal in response to the message sent from the maintenance-target facilities, and the called maintenance terminal executes the maintenance of the maintenance-target facilities on the Internet with reference to the message and the maintenance information stored in the WWW server.

According to this system, the maintenance-target facilities perform the self-diagnostics, and quickly send a message based on the results of diagnostics on the Internet. The WWW server receiving the message on the Internet can operate the maintenance terminal to execute quickly the appropriate maintenance processing based on contents of the message. Via the maintenance terminal, entry of the maintenance information and renewal of the maintenance information on the WWW server side can be easily executed. Since connections to the maintenance-target device in all the world are performed on the Internet, communication costs can be lower than those of the communication on a public network.

Japanese Patent Laying-Open No. 2000-99542 has disclosed a system, in which a user himself or herself can easily extract, process and/or display data kept in a database and required by the user. This system includes a setting circuit, which is used for inquiring and extracting the information required by the user from the database, and particularly is used for setting the information to be extracted and a display format thereof, as well as a retrieving circuit for retrieving schema definition information based on the extracted information, a preparing circuit for preparing an inquiry statement, changing circuit for changing the schema when the data required by the user cannot be obtained from the database, and a display circuit for displaying the data obtained in response to the inquiry in the display format set by the setting circuit.

According to this system, when the user determines the item to be extracted from the database, the display format and the conditions, the retrieving circuit retrieves the schema definition information based on the information thus set. The preparing circuit prepares the inquiry statement by using the information of the data structure in the database obtained by the retrieval. The display circuit formats and displays the information extracted from the database in the display format set by the user. Thereby, the user using the database of, e.g., production results data including huge time-series data can easily extract, process and display the data required by the user himself/herself.

Japanese Patent Laying-Open No. 11-345213 has disclosed a system, in which past detailed process data can be stored in a format facilitating later utilization, and loads on computers can be reduced. This system includes a process computer, an application server, which executes preprocessing by dividing the process data stored in the process computer into data groups each having an appropriate amount of data and adding key information, and controls the extraction of the process data from the database server in accordance with the request applied from a client terminal, a database server for building the database based on the preprocessed process data, and the client terminal for accessing the application server and receiving the process data therefrom.

According to this system, all the process data is preprocessed into forms facilitating later utilization. By storing all the process data in this manner, various detailed data determined at the time of manufacturing of the products can be extracted and referred to, e.g., when the problem arises in quality of shipped products. Consequently, such a problem in quality can be clearly and properly diagnosed.

Japanese Patent Laying-Open No. 6-266634 discloses a system, which can appropriately execute total and preventive maintenance on a huge number of terminal devices. This system includes the plurality of terminal devices and a monitoring device for performing centralized monitoring of the plurality of terminal devices. The terminal device includes a detecting circuit for detecting input of information and occurrence of an abnormality based on the input information, and a sending circuit for successively sending the detected information to the monitoring device in time sequence. The monitoring device includes a predicting circuit, which performs statistical processing on the information sent in time sequence from the plurality of terminal devices, and thereby predicts the degree of occurrence of the abnormality and the degree of abnormal maintenance emergency, and a control circuit for controlling the maintenance of the plurality of terminal devices.

According to this system, each terminal device detects the input of information and the occurrence of the abnormality based on this input of the information, and the detected information is successively sent to the monitoring device in time sequence. The monitoring device compiles the detected information sent from the plurality of terminal devices in time sequence, and performs the statistical processing on the same. In this processing, the predicting circuit predicts the degree of occurrence of the abnormality and the degree of emergency of the abnormal maintenance for each terminal device, and the control circuit controls the maintenance of the plurality of terminal devices based on the predicted degree of occurrence of the abnormality and the predicted degree of emergency of the abnormal maintenance. Consequently, the total preventive maintenance of the huge number of terminal devices can be appropriately executed.

For monitoring the quality of semiconductor chips manufactured through complicated steps, it is necessary to determine factors such as steps, manufacturing apparatuses in these steps, variations occurring in manufacturing conditions of the manufacturing apparatus with time, differences in manufacturing conditions between the plurality of manufacturing apparatuses arranged in the step, and maintenance statuses in the manufacturing apparatuses. However, neither the foregoing system alone nor the combination of the foregoing systems can appropriately determine such complicated many factors to inform a supervisor or operator of such factors. Consequently, even when quality trouble occurs, a long time is required for determining the factor thereof. Until the factor is determined, it is necessary to stop the manufacturing apparatus, which remarkably lowers the rate of operation of the expensive facilities as well as the productivity.

SUMMARY OF THE INVENTION

An object of the invention is to provide a manufacturing line monitoring system, which can easily monitor a large number of manufacturing apparatuses in a manufacturing process formed of the manufacturing apparatuses.

Another object of the invention is to provide a manufacturing line monitoring system, which can appropriately monitor a large number of manufacturing apparatuses in a manufacturing process formed of the manufacturing apparatuses.

Still another object of the invention is to provide a manufacturing line monitoring system, which can easily monitor products manufactured by a large number of manufacturing apparatuses in a manufacturing process formed of the manufacturing apparatuses.

Yet another object of the invention is to provide a manufacturing line monitoring system, which can appropriately monitor products manufactured by a large number of manufacturing apparatuses in a manufacturing process formed of the manufacturing apparatuses.

A manufacturing line monitoring system according to the invention monitors a manufacturing process formed of a plurality of manufacturing apparatuses. This system includes collecting means for collecting information from each of the manufacturing apparatuses, first storage means for storing the collected information, first preparing means for preparing first information relating to results of manufacturing by each of the manufacturing apparatuses based on the stored information, second preparing means for preparing second information relating to variations in the results based on the first information, first output means for outputting the first information and the second information in a manner linking the first information and the second information with each other, and first transferring means for transferring alarm information based on one of the first information and the second information.

Preferably, the manufacturing line monitoring system according to the invention further includes third preparing means for preparing third information relating to differences in results between the manufacturing apparatuses based on the first information. The first output means includes means for outputting the first information, the second information and the third information in a manner linking the second information and the third information with each other.

More preferably, the manufacturing line monitoring system according to the invention includes second storage means for storing maintenance schedule information relating to maintenance schedules of the respective manufacturing apparatuses, fourth preparing means for preparing fourth information relating to results of maintenance of the respective manufacturing apparatuses based on the stored information, and second output means for outputting the maintenance schedule information and the fourth information in a manner linking the maintenance schedule information and the fourth information with each other.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 illustrates a control master database stored on a fixed disk of the facility operation monitoring host computer;

FIG. 5 illustrates a status database stored on the fixed disk of the facility operation monitoring host computer;

FIG. 6 illustrates a building-specific status database stored on the fixed disk of the facility operation monitoring host computer;

FIG. 7 illustrates a floor-specific status database stored on the fixed disk of the facility operation monitoring host computer;

FIG. 8 illustrates an area-specific status database stored on the fixed disk of the facility operation monitoring host computer;

FIG. 9 illustrates a lot control database stored on the fixed disk of the facility operation monitoring host computer;

FIG. 10 illustrates a quality control database stored on the fixed disk of the facility operation monitoring host computer;

FIG. 11 illustrates a failure control database stored on the fixed disk of the facility operation monitoring host computer;

FIG. 12 illustrates an operation status database stored on the fixed disk of the facility operation monitoring host computer;

FIG. 13 illustrates an operation status database (daily reports) stored on the fixed disk of the facility operation monitoring host computer;

FIG. 14 illustrates an operation status database (weekly reports) stored on the fixed disk of the facility operation monitoring host computer;

FIG. 15 illustrates an operation status database (monthly reports) stored on the fixed disk of the facility operation monitoring host computer;

FIG. 16 illustrates an alarm control database stored on the fixed disk of the facility operation monitoring host computer;

FIG. 17 illustrates a manufacturing schedule database stored on the fixed disk of the facility operation monitoring host computer;

FIG. 18 illustrates a maintenance master database stored on the fixed disk of the facility operation monitoring host computer;

FIG. 19 illustrates a maintenance schedule database stored on the fixed disk of the facility operation monitoring host computer;

FIG. 30 shows apparatus-specific current statuses displayed on the screen of the monitor in the facility operation monitoring system;

FIG. 31 shows area-specific histories displayed on the screen of the monitor in the facility operation monitoring system;

FIG. 36 shows apparatus-specific histories (monthly reports) displayed on the screen of the monitor in the facility operation monitoring system;

FIG. 38 shows apparatus comparison histories (monthly reports) displayed on the screen of the monitor in the facility operation monitoring system;

FIG. 40 shows a periodical maintenance schedule displayed on the screen of the monitor in the facility operation monitoring system;

FIG. 41 shows results of the periodical maintenance displayed on the screen of the monitor in the facility operation monitoring system;

FIG. 42 shows a failure entry screen of the monitor in the facility operation monitoring system; and FIG. 43 shows a failure analysis displayed on the screen of the monitor in the facility operation monitoring system;

DESCRIPTION OF THE PREFERRED EMBODIMENTS

Embodiment of the invention will be described below with reference to the drawings. In the following description and drawings, the same parts and portions bear the same reference numbers and names, and perform the same functions. Therefore, description thereof is not repeated.

Figure 1:
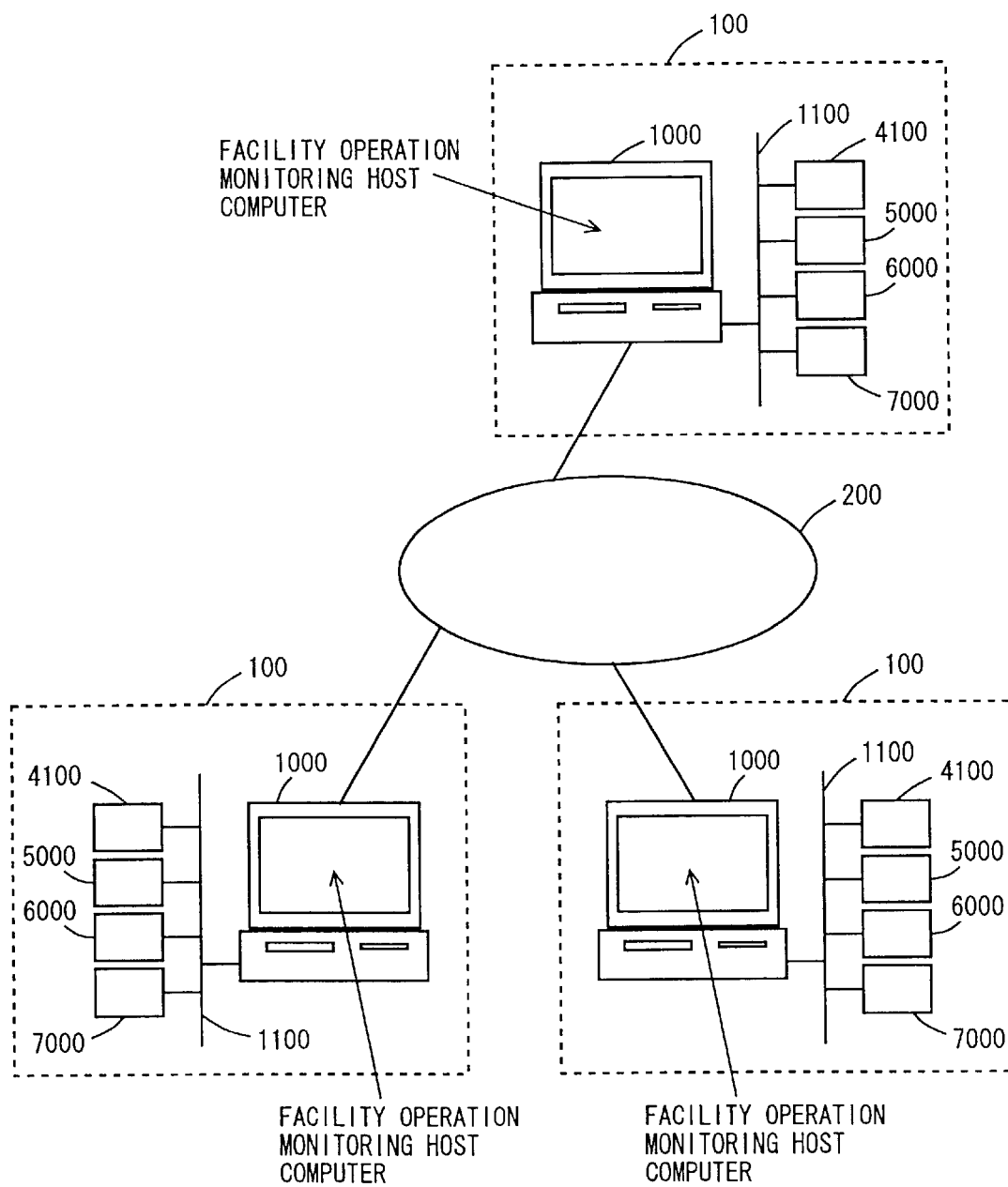
FIG. 1 shows a whole structure of a facility operation monitoring system according to an embodiment of the invention.

Referring to FIG. 1, a whole structure of a facility operation monitoring system according to an embodiment will now be described. As shown in FIG. 1, a facility operation monitoring system 100 is arranged in each of production sites or bases. A plurality of facility operation monitoring systems 100 may be provided in each production site. Facility operation monitoring systems 100 arranged in the respective production sites are connected together on Internet 200. Therefore, facility operation monitoring system 100 in one of the production sites can obtain information from facility operation monitoring system 100 in another production site.

Facility operation monitoring system 100 includes a facility operation monitoring host computer 1000, a FA computer 4100 connected to respective manufacturing apparatuses for communication with them, a control terminal 5000 used by a supervisor for monitoring information stored in facility operation monitoring host computer 1000, an information collecting computer 6000 for collecting information of the manufacturing apparatuses from FA computer 4100, and an alarm transferring computer 7000 for transferring an alarm to the supervisor in response to a request by facility operation monitoring host computer 1000. FA computer 4100, control terminal 5000, information collecting computer 6000 and alarm transferring computer 7000 are connected to facility operation monitoring host computer 1000 on a LAN (Local Area Network) 1100. The plurality of facility operation monitoring systems 100 are connected together on Internet 200.

Figure 2:
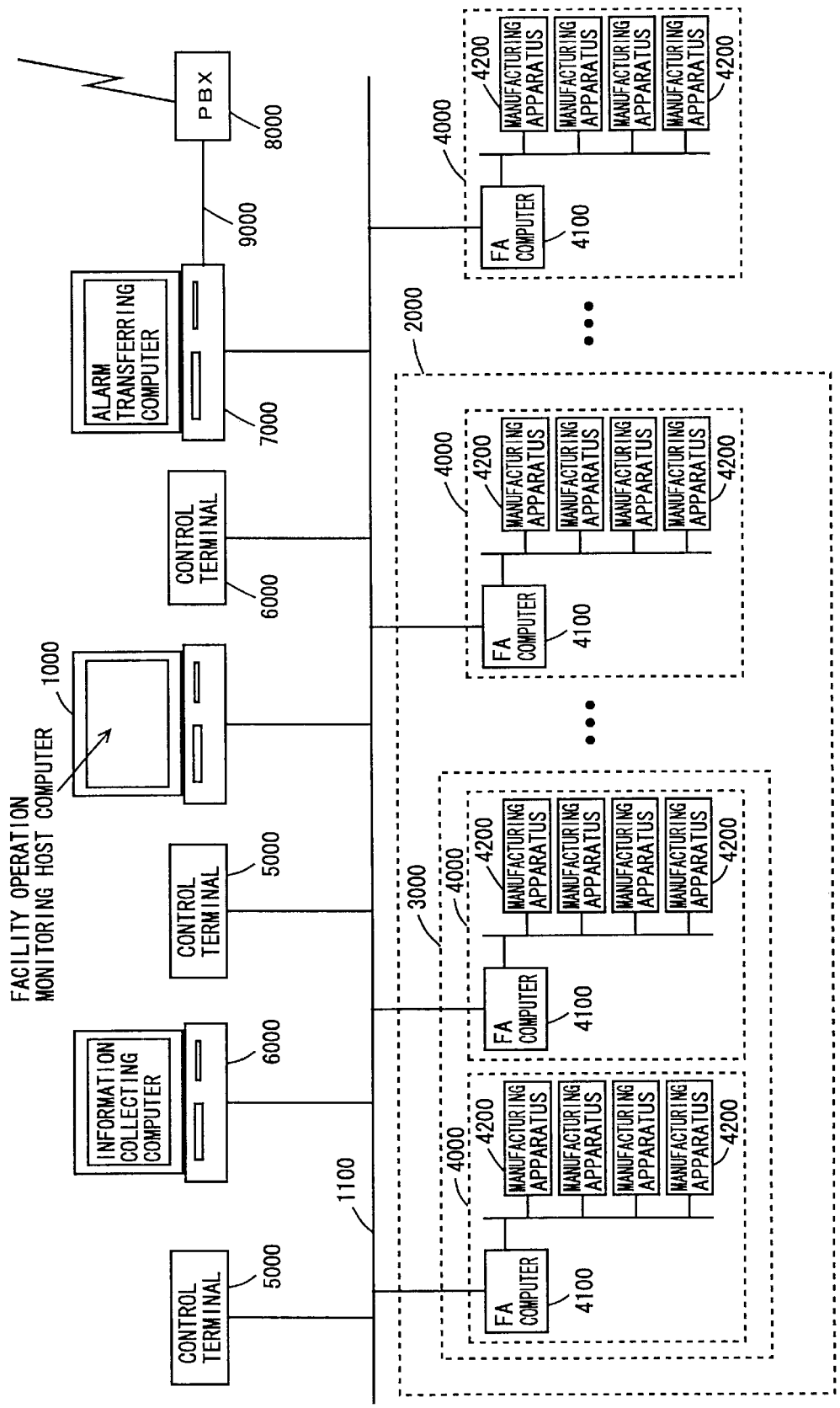
FIG. 2 shows a structure of the facility operation monitoring system.

Referring to FIG. 2, a structure of facility operation monitoring system 100 will now be described. As shown in FIG. 2, facility operation monitoring system 100 is formed of a plurality of computers including facility operation monitoring host computer 1000, which is arranged on LAN 1100 and forms the nucleus of the system. Manufacturing apparatuses 4200 are controlled on an area-by-area basis, and thus are collectively controlled in each of areas, which are provided in each of floors of a plurality of buildings. One production site includes the plurality of buildings. A common building region 2000 of each building includes a plurality of common floor regions 3000. Each common floor region 3000 includes a plurality of common area regions 4000. One common area region 4000 is formed of at least one FA computer 4100 and the plurality of manufacturing apparatuses 4200.

FA computer 4100 and manufacturing apparatus 4200 are connected on LAN 1100. Manufacturing apparatus 4200 sends operation information and quality information to FA computer 4100. FA computer 4100 sends information such as process complication information, operation information and quality information, which are received from manufacturing apparatus 4200 to information collecting computer 6000. Information collecting computer 6000 sends the information received from the plurality of FA computers 4100 to facility operation monitoring host computer 1000.

Facility operation monitoring host computer 1000 operates in accordance with a predetermined program, and constructs various databases based on the information received from information collecting computer 6000. Facility operation monitoring host computer 1000 instructs alarm transferring computer 7000 to transfer alarm information. Alarm transferring computer 7000 sends the alarm information via a PBX (Private Branch Exchange) 8000 connected to a PBX connection line 9000 to a pager, a PHS (Personal Handy-phone System) or the like of the supervisor.

For example, control terminal 5000 has a monitor with a touch panel, and is used by the supervisor for monitoring the database stored in facility operation monitoring host computer 1000.

Figure 3:
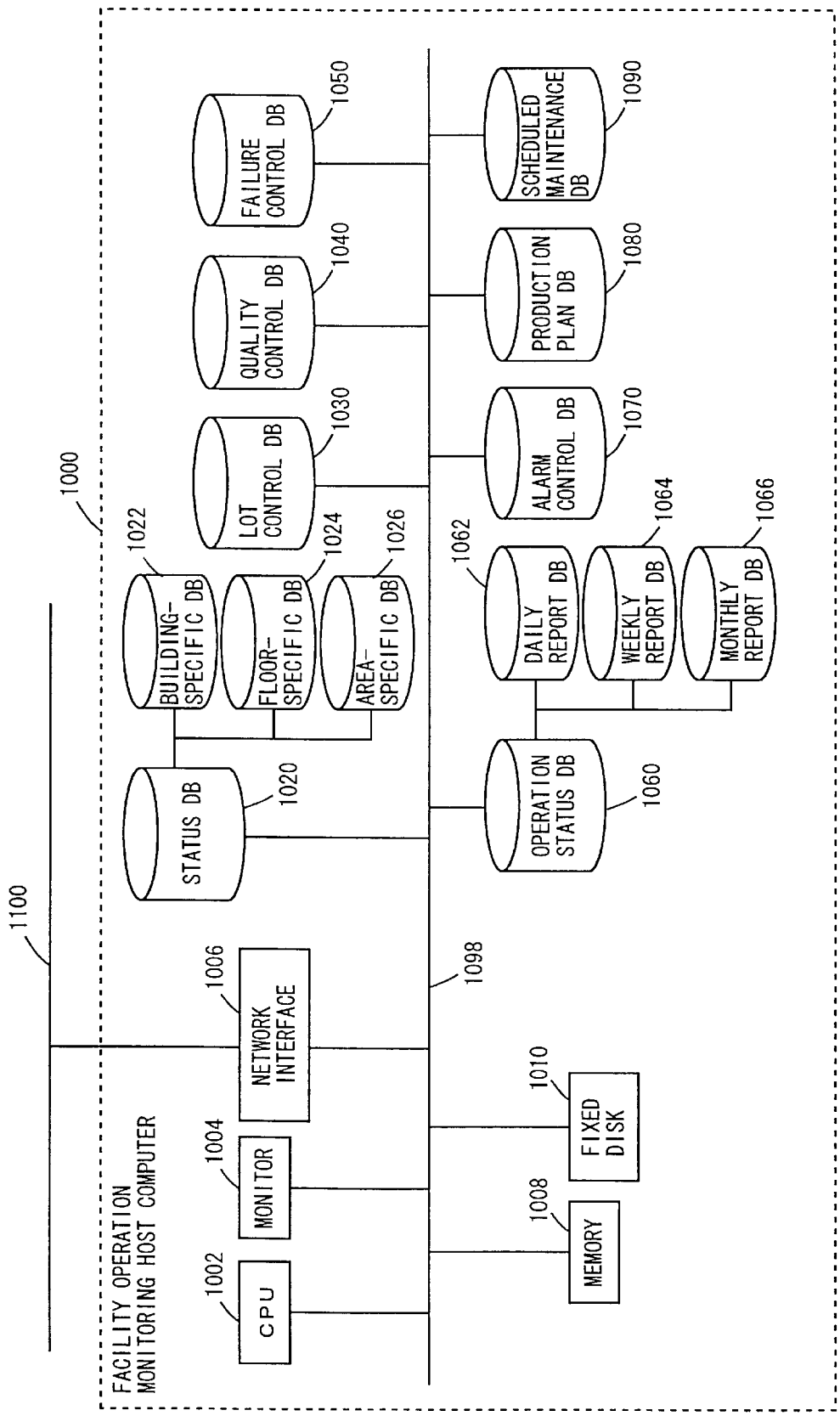
FIG. 3 is a schematic block diagram illustrating a facility operation monitoring host computer.

Referring to a block diagram of FIG. 3, facility operation monitoring host computer 1000 will now be described. As illustrated in FIG. 3, facility operation monitoring host computer 1000 includes a CPU (Central Processing Unit) 1002 controlling the facility operation monitoring system, a monitor 1004 providing various kinds of information, a network interface 1006 controlling the network connected to LAN 1100, a memory 1008 storing programs to be executed by CPU 1002 and results of operations obtained during execution of the programs, and a fixed disk 1010 storing various databases.

The databases stored on fixed disk 1010 includes a status database 1020 storing a current status of manufacturing apparatus 4200, a building-specific database 1022 prepared based on the data stored in status database 1020, a floor-specific database 1024 and an area-specific database 1026. The databases stored on fixed disk 1010 include a lot control database 1030 for controlling products on a lot-by-lot basis, a quality control database 1040 for controlling the quality of products, and a failure control database 1050 for controlling a failure status of manufacturing apparatus 4200. Further, the databases stored on fixed disk 1010 include an operation status database 1060 prepared based on the status information representing the current operation status of manufacturing apparatus 4200 as well as daily, weekly and monthly report databases 1062, 1064 and 1066 prepared based on the data stored in operation status database 1060. Further, the databases stored on fixed disk 1010 include an alarm control database 1070 for transferring alarm information to the supervisor via alarm transferring computer 7000, a production schedule database 1080 for storing a production schedule, and a periodical maintenance database 1090 for storing the schedule and results of periodical maintenance.

CPU 1002, monitor 1004, network interface 1006, memory 1008, fixed disk 1010 and the foregoing databases are connected via a bus 1098. Network interface 1006 is connected to LAN 1100.

Referring to FIGS. 4–19, contents of the databases shown in FIG. 3 will now be described.

Figure 4:
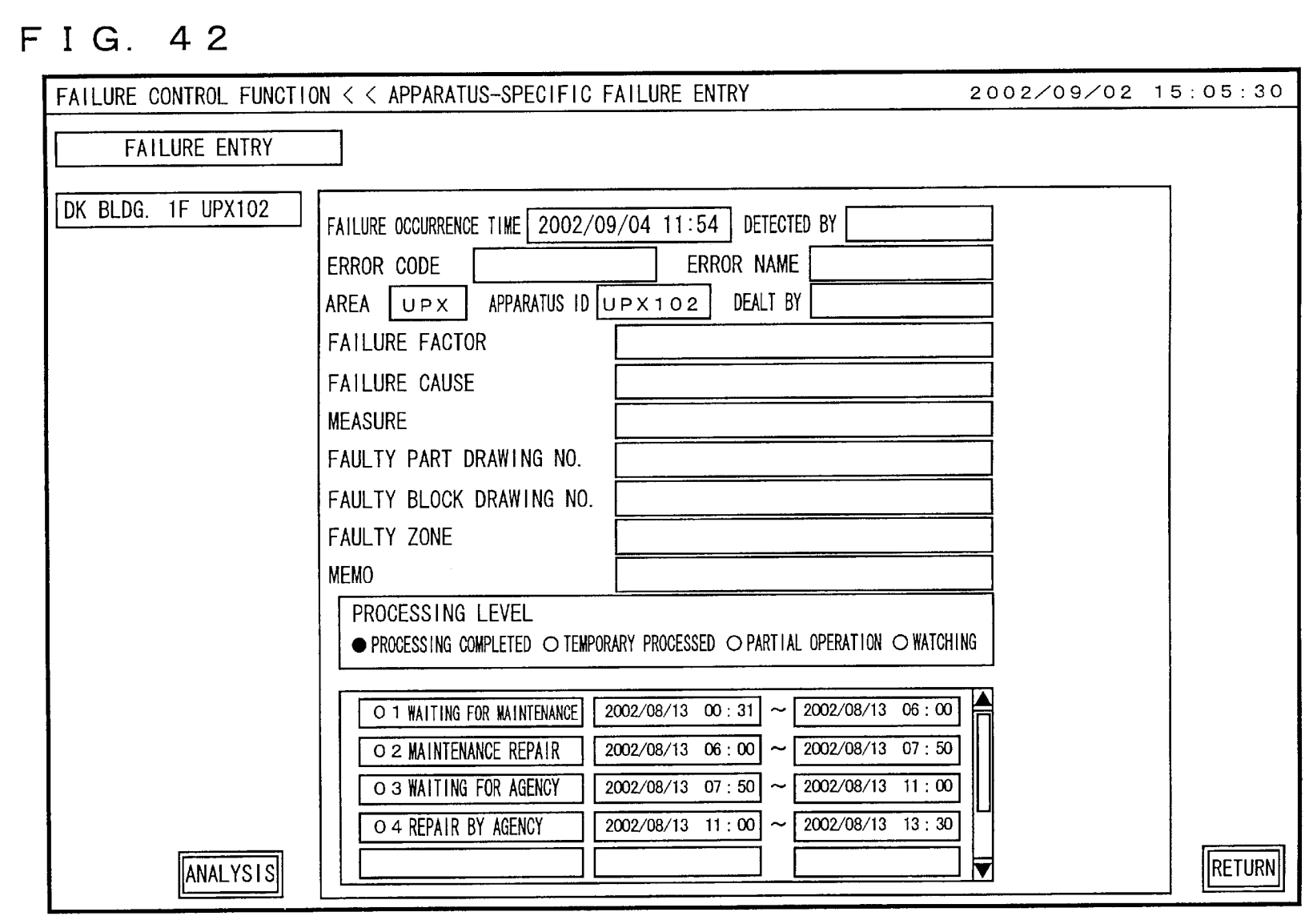

FIG. 4 illustrates contents of the control master database stored on fixed disk 1010. The contents stored in this control master database include control numbers for identifying respective manufacturing apparatuses 4200, building numbers each representing the building provided with manufacturing apparatus 4200, floor numbers each representing a number of floor provided with manufacturing apparatus 4200, area numbers each representing a number of an area provided with manufacturing apparatus 4200, apparatus numbers each functioning as an apparatus ID for identifying the apparatus number, apparatus names and apparatus functions. For example, manufacturing apparatus 4200 controlled with a key data of the control number of "10384132" is installed in an "SPX" area on the first floor of a building represented by the building number of "DK", and bears the apparatus number of "102". This apparatus is a vacuum plating apparatus, and has a function of "full FA". The apparatus function is selected from "full FA", "semi-FA", "semi-automatic" and "manual". In the mode of "full FA", products are transported fully automatically in a bay (automatic apparatus and automatic transportation). In a mode of "semi-FA", products is transported manually in a bay (automatic apparatus and manual transportation). In a mode of "semi-automatic", products are transported manually in a bay, and conditions are provided to the apparatus from a host system (semiautomatic apparatus and manual transportation). In a mode of "manual", products are transported manually in a bay, and conditions are provided manually to the apparatus (offline apparatus and manual transportation).

Referring to FIG. 5, contents stored in status database 1020 will now be described. As illustrated in FIG. 5, contents stored in status database 1020 include statuses and others relating to each of the control numbers for identifying manufacturing apparatuses 4200, and particularly stores a first receive status, a second receive status, an Nth receive status, a current status, a current apparatus mode, a list of lots in process and a list of lots waiting for processing. The first receive status is information representing the last status of manufacturing apparatus 4200 received by facility operation monitoring host computer 1000.

Contents of the status received as the first receive status as well as the data and time of reception are stored. For example, information of the last status representing the "operating" status has been received from manufacturing apparatus 4200 identified by the control number of "67432982". Therefore, "operating" is stored as the current status. Manufacturing apparatus 4200 identified by the control number "67432982" is currently in the apparatus mode of "full automatic", and the lot numbers are stored for representing a list of the lots, which are being processed by manufacturing apparatus 4200, and a list of lots waiting for the processing. Five kinds of statuses, i.e., "operating", "waiting", "failure", "periodical maintenance" and "scheduled stop" are used.

Referring to FIG. 6, description will now be given on contents stored in building-specific database 1022. As illustrated in FIG. 6, building-specific database 1022 stores contents organized by the building number, floor number and area number, and particularly stores the number of manufacturing apparatuses 4200 in each of the statuses. By compiling the statuses, five kinds of numbers of the apparatuses are stored, and more specifically, the "number of operating apparatuses", "number of waiting apparatuses", "number of faulty apparatuses", "number of apparatuses under periodical maintenance" and "number of apparatuses under scheduled stop" are stored.

Referring to FIG. 7, description will now be given on contents stored in floor-specific database 1024. As illustrated in FIG. 7, floor-specific database 1024 stores contents organized by the building number, floor number and area number, and particularly stores the control numbers of manufacturing apparatuses 4200 in each of the statuses. Although foregoing building-specific database 1022 stores only the number of manufacturing apparatuses 4200 in each status, floor-specific database 1024 illustrated in FIG. 7 stores not only the number of apparatuses but also the control numbers of manufacturing apparatuses 4200 in each of the statuses.

Referring to FIG. 8, contents stored in area-specific database 1026 will now be described. As illustrated in FIG. 8, area-specific database 1026 stores contents organized by the building number, floor number and area number, and particularly stores the status, apparatus function and the number of lots in process (or under waiting) relating to each control number of manufacturing apparatus 4200.

Referring to FIG. 9, contents stored in lot control database 1030 will now be described. As illustrated in FIG. 9, lot control database 1030 stores contents organized by the lot control number for identifying the lot, and particularly stores the step, in which the lot is currently present, the manufacturing manner of the lot, the number of workpieces such as semiconductor wafers included in the lot, and the number of lots.

Referring to FIG. 10, contents stored in quality control database 1040 will now be described. As illustrated in FIG. 10, quality control database 1040 stores contents organized by the lot control number for identifying the lot, and particularly stores a quality history, a quality trouble, a step causing the quality trouble, the control number of the apparatus causing the quality trouble and trouble information.

Referring to FIG. 11, contents stored in failure control database 1050 will now be described. As illustrated in FIG. 11, failure control database 1050 store contents organized by the control number of manufacturing apparatuses 4200, and particularly stores an error code for determining the failure, a name of the error corresponding to the error code, a name of an operator dealing with the failure, a factor of the failure, a cause of the failure, an alarm transference flag indicating the fact that the alarm information was transferred, and the alarm information.

Referring to FIG. 12, contents stored in operation status database 1060 will now be described. As illustrated in FIG. 12, operation status database 1060 stores contents organized by the control number of manufacturing apparatuses 4200, and particularly stores a compilation of the operations for multiple days and a compilation of the results. For example, as a compilation of operations on Sep. 1, 2003 (year/month/day), database 1060 stores a list of times, when manufacturing apparatus 4200 is in the operation status, as well as a list of times of the waiting status, a list of times of the failure status, a list of times of the periodical maintenance and a list of times of the scheduled stop already executed. For example, the stored information represents that the manufacturing apparatus 4200 identified by the control number of "6743276" operated from 0:50 to 1:45, from 2:45 to 6:30, and from 11:00 to 16:30 on Sep. 1, 2002. The summing of these operations are performed base on the receive status stored in status database 1020 illustrated in FIG. 5.

The compilation of results includes an output of manufacturing apparatus 4200 per time zone as well as the number of products in process. For example, in connection with the manufacturing apparatus 4200 identified by the control number of "6743276" and the time period from 0:00 to 1:00 on Sep. 1, 2002, it is stored that the output of products is equal to "212", and the number of products in process is equal to "2618".

In the above manners, the compilation of operations and the compilation of results, which relate to only a predetermined number of days, are stored in operation status database 1060.

Referring to FIG. 13, contents stored in daily report database 1062 will now be described. As illustrated in FIG. 13, daily report database 1062 stores contents organized by the control number for identifying the manufacturing apparatus 4200, and particularly stores a compilation of the operations and a compilation of the result, which are obtained for predetermined days. As illustrated in FIG. 13, the compilation of operations includes a total of operation times, a total of failure times, a total of periodical maintenance times and a total of scheduled stops. The compilation of results includes the output and the number of products in process relating to each of a night shift, an early shift and a late shift. The contents stored in daily report database 1062 illustrated in FIG. 13 are prepared based on the contents stored in foregoing operation status database 1060 in FIG. 12, Referring to FIG. 14, contents stored in weekly report database 1064 will now be described. As illustrated in FIG. 14, weekly report database 1064 stores contents organized by the control number for identifying the manufacturing apparatus 4200, and particularly stores a compilation of operations and a compilation of results per week. The contents stored in weekly report database 1064 illustrated in FIG. 14 are prepared based on the contents stored in foregoing daily report database 1062 illustrated in FIG. 13.

Referring to FIG. 15, contents stored in monthly report database 1066 will now be described. As illustrated in FIG. 15, monthly report database 1066 stores contents organized by the control number for identifying the manufacturing apparatus 4200, and particularly stores a compilation of operations and a compilation of results per month. The contents stored in monthly report database 1066 illustrated in FIG. 15 are prepared based on the contents stored in foregoing weekly report database 1064 illustrated in FIG. 14.

Referring to FIG. 16, contents stored in alarm control database 1070 will now be described. As illustrated in FIG. 16, contents stored in alarm control database 1070 include a combination of a database relating to facility failures (including failures of the system, network, apparatus and others) and a database relating to quality abnormalities. The facility failure database in the alarm control database stores contents organized by the control number for identifying the manufacturing apparatus 4200, and particularly stores an error code indicating a failure of the apparatus, a name of error, a step of occurrence, a time of failure occurrence, a time of alarming and alarm information. The contents stored in the facility failure database of the alarm control database are prepared based on contents stored in foregoing failure control database 1050 illustrated in FIG. 11.

As illustrated in FIG. 16, the quality abnormality database stores contents organized by the lot control number for identifying the lot, and particularly stores a quality trouble code, a quality trouble name, a step of occurrence, a control number, an alarming time and alarm information. The contents stored in the quality abnormality database of the alarm control database are prepared based on the contents stored in foregoing quality control database 1040 illustrated in FIG. 10.

Referring to FIG. 17, contents stored in production schedule database 1080 will now be described. As illustrated in FIG. 17, production schedule database 1080 stores contents organized by the control number for identifying the manufacturing apparatus 4200, and particularly stores a planned output per day.

Referring to FIG. 18, contents of the maintenance master database stored on fixed disk 1010 will now be described. As illustrated in FIG. 18, contents stored in the maintenance master database include a name of the maintenance, an interval between maintenance operations and a unit of the interval organized by the maintenance code.

Referring to FIG. 19, contents stored in periodical maintenance database 1090 will now be described. As illustrated in FIG. 19, periodical maintenance database 1090 stores contents organized by the control number for identifying the manufacturing apparatus 4200, and particularly stores a maintenance code, a current interval, an executed maintenance date, a scheduled maintenance date, an alarm date of transference of alarm about the fact that the executed maintenance date is later than the scheduled date, schedule change data, delay data and operation contents data.

Figure 20:
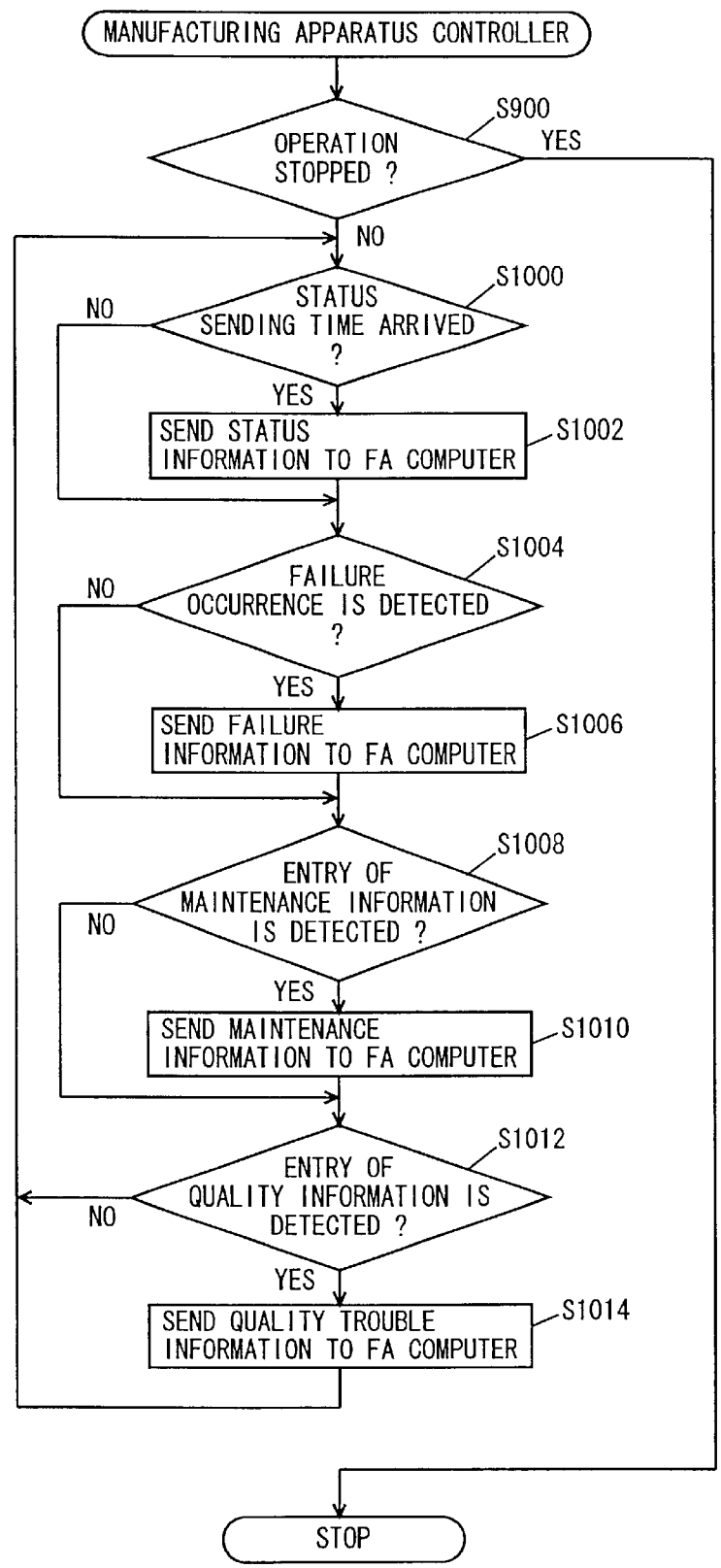
FIG. 20 is a flowchart illustrating procedures of control by a manufacturing apparatus controller in the facility operation monitoring system.

Referring to FIG. 20, a control structure of a program executed by the controller of manufacturing apparatus 4200 will now be described.

In a step S900, the controller of manufacturing apparatus 4200 determines whether a stop operation is detected or not. When the stop operation is detected (YES in step S900), the processing moves to a step S1000. Otherwise, the processing ends, and manufacturing apparatus 4200 stops. In step S1000, the controller of manufacturing apparatus 4200 determines whether the status sending time has arrived or not. If the status sending time has arrived (YES in step S1000), the processing moves to a step S1002. Otherwise, the processing moves to a step S1004.

In step S1002, the controller of manufacturing apparatus 4200 sends status information to FA computer 4100.

In step S1004, the controller of manufacturing apparatus 4200 determines whether occurrence of a failure is detected or not. If the failure occurrence is detected (YES in step S1004), the processing moves to a step S1006. If not (NO in step S1004), the processing moves to a step S1008.

In step S1006, the controller of manufacturing apparatus 4200 sends failure information to FA computer 4100.

In S1008, the controller of manufacturing apparatus 4200 determines whether entry of maintenance information is detected or not. When an operator performing the maintenance enters the execution of maintenance as the maintenance information, entry of the maintenance information is detected. When the entry of maintenance input is detected (YES in step S1008), the processing moves to a step S1010. If not (NO in step S1008), the processing moves to a step S1012.

In step S1010, the controller of manufacturing apparatus 4200 sends maintenance information to FA computer 4100.

In step S1012, the controller of manufacturing apparatus 4200 determines whether entry of quality information is detected or not. When an operator enters the quality information via an input device provided in manufacturing apparatus 4200, the entry of quality information is detected. When the entry of quality information is detected (YES in step S1012), the processing moves to a step S1014. If not (NO in step S1012), the processing returns to step S1000.

In step S1014, the controller of manufacturing apparatus 4200 sends quality trouble information to FA computer 4100. Thereafter, the processing returns to step S1000.

In this manner, the controller of manufacturing apparatus 4200 repeats the sending of status information, the sending of failure information, the sending of maintenance information and the sending of quality trouble information.

Figure 21:
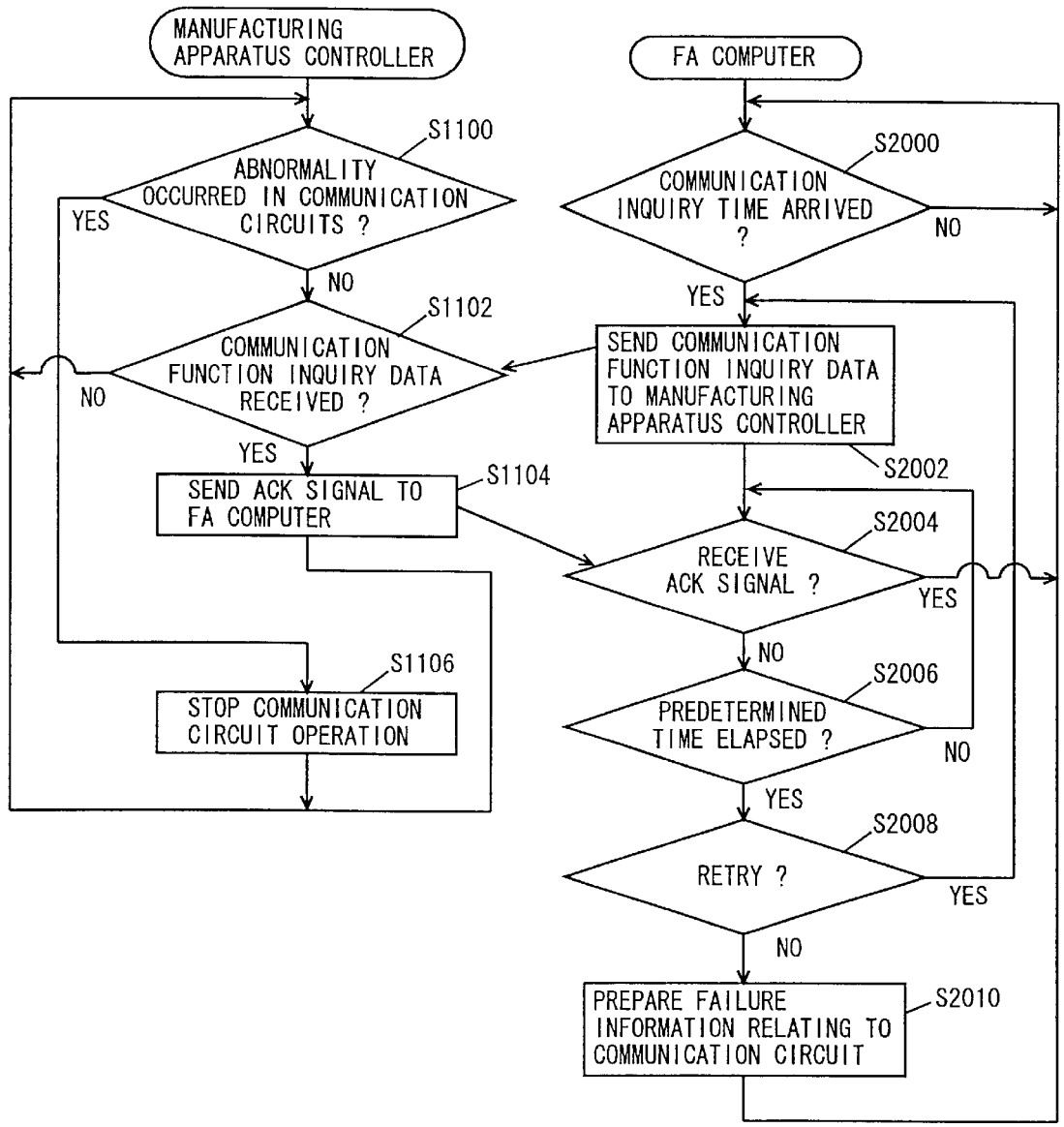
FIG. 21 is a flowchart illustrating procedures of control of communication abnormality detecting processing in the facility operation monitoring system.

Referring to FIG. 21, the program executed by the controller of manufacturing apparatus 4200 and FA computer 4100 has the following control structure.

In a step S1100, the controller of manufacturing apparatus 4200 determines whether an abnormality occurred in connection with the communication circuits or not. If the abnormality occurred in connection with the communication circuits (YES in step S1100), the processing moves to a step S1106. If not (NO in step S1100), the processing moves to a step S1102.

In step S1102, the controller of manufacturing apparatus 4200 determines whether communication function inquiry data is received from FA computer 4100 or not. When communication function inquiry data is received (YES in step S102), the processing moves to a step S1104. If not (NO in step S1102), the processing returns to step S1100.

In step S1104, the controller of manufacturing apparatus 4200 sends an ACK signal to FA computer 4100. Thereafter, the processing returns to step S1100.

In step S1106, the controller of manufacturing apparatus 4200 stops the operation of the communication circuits. Thereafter, the processing returns to step S1100.

In a step S2000, FA computer 4100 determines whether a communication inquiry time has arrived or not. If the communication inquiry time has arrived (YES in step S2000), the processing moves to a step S2002. If not (NO in step S2000), the processing returns to step S2000.

In step S2002, FA computer 4100 sends the communication function inquiry data to the controller of manufacturing apparatus 4200.

In step S2004, FA computer 4100 determines whether the ACK signal is received from the controller of manufacturing apparatus 4200 or not. If the ACK signal is received (YES in step S2004), the processing returns to step S2000. If not (NO in step S2004), the processing moves to a step S2006.

In step S2006, FA computer 4100 determines whether a predetermined time has elapsed after the communication function inquiry data is sent to the controller of manufacturing apparatus 4200 or not. If the predetermined time has elapsed (YES in step S2006), the processing moves to a step S2008. If not (NO in step S2006), the processing returns to step S2004 for waiting for reception of the ACK signal from the controller of manufacturing apparatus 4200.

In a step S2008. FA computer 4100 determines whether retrial is to be performed or not. If the retrial is to be performed (YES in step S2008), the processing returns to step S2002. If not (NO in step S2008), the processing moves to a step S2010.

In step S2010, FA computer 4100 prepares failure information relating to the communication circuits. Thereafter, the processing returns to step S2000.

Figure 22:
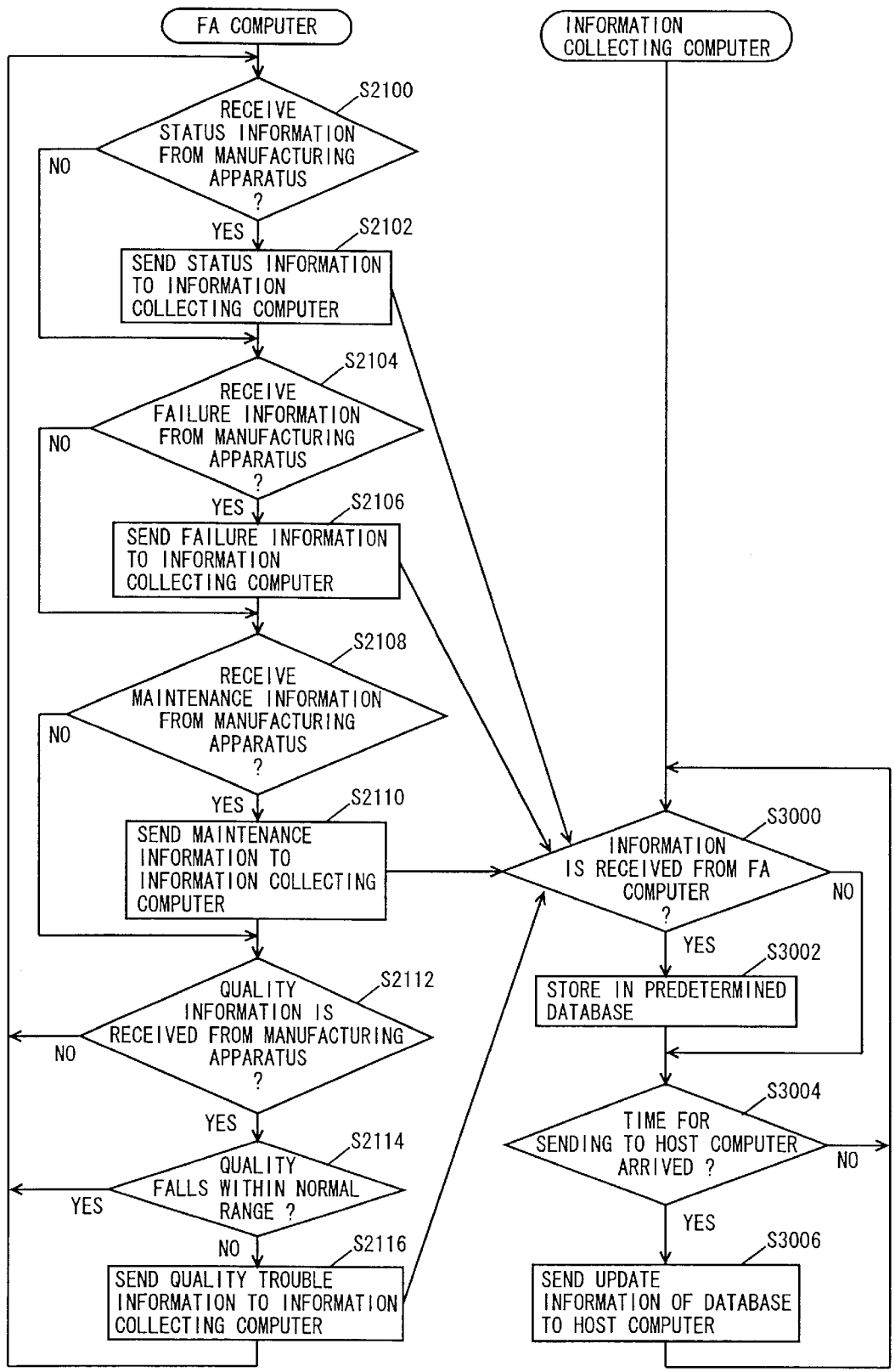
FIG. 22 is a flowchart illustrating procedures of control of information collecting processing in the facility operation monitoring system.

Referring to FIG. 22, the program executed by FA computer 4100 and information collecting computer 6000 has the following control structure in connection with the communication processing.

In a step S2100, FA computer 4100 determines whether the status information is received from the controller of manufacturing apparatus 4200 or not. If the status information is received from the controller of manufacturing apparatus 4200 (YES in step S2100), the processing moves to a step S2102. If not (NO in step S2100), the processing moves to a step S2104.

In step S2102, FA computer 4100 sends the status information to information collecting computer 6000.

In step S2104, FA computer 4100 determines whether the failure information is received from the controller of manufacturing apparatus 4200 or not. If the failure information is received from the controller of manufacturing apparatus 4200 (YES in step S2104), the processing moves to a step S2106. If not (NO in step S2104), the processing moves to a step S2108.

In step S2106, FA computer 4100 sends the failure information to information collecting computer 6000.

In step S2108, FA computer 4100 determines whether the maintenance information is received from the controller of manufacturing apparatus 4200 or not. If the maintenance information is received from the controller of manufacturing apparatus 4200 (YES in step S2108), the processing moves to a step S2110. If not (NO in step S2108), the processing moves to a step S2112.

In step S2110, FA computer 4100 sends the maintenance information to information collecting computer 6000.

In step S2112, FA computer 4100 determines whether the quality information is received from the controller of manufacturing apparatus 4200 or not. If the quality information is received from the controller of manufacturing apparatus 4200 (YES in step S2112), the processing moves to a step S2114. If not (NO in step S2112), the processing returns to step S2100.

In step S2114, FA computer 4100 determines whether the quality falls within a normal range or not. If the quality falls within a normal range (YES in step S2114), the processing returns to step S2100. If not (NO in step S2114), the processing moves to a step S2116.

In step S2116, FA computer 4100 sends quality trouble information to information collecting computer 6000.

In a step S3000, information collecting computer 6000 determines whether information is received from FA computer 4100 or not. If the information is received from FA computer 4100 (YES in step S3000), the processing moves to a step S3002. If not (NO in step S3000), the processing moves to a step S3004.

In step S3002, information collecting computer 6000 stores information received from a predetermined database.

In step S3004, information collecting computer 6000 determines whether the time for sending to facility operation monitoring host computer 1000 has arrived or not. If the time for sending to facility operation monitoring host computer 1000 has arrived (YES in step S3004), the processing moves to a step S3006. If not (NO in step S3004), the processing returns to step S3000.

In step S3006, information collecting computer 6000 sends update information of the database to facility operation monitoring host computer 1000. Thereafter, the processing returns to step S3000.

Figure 23:
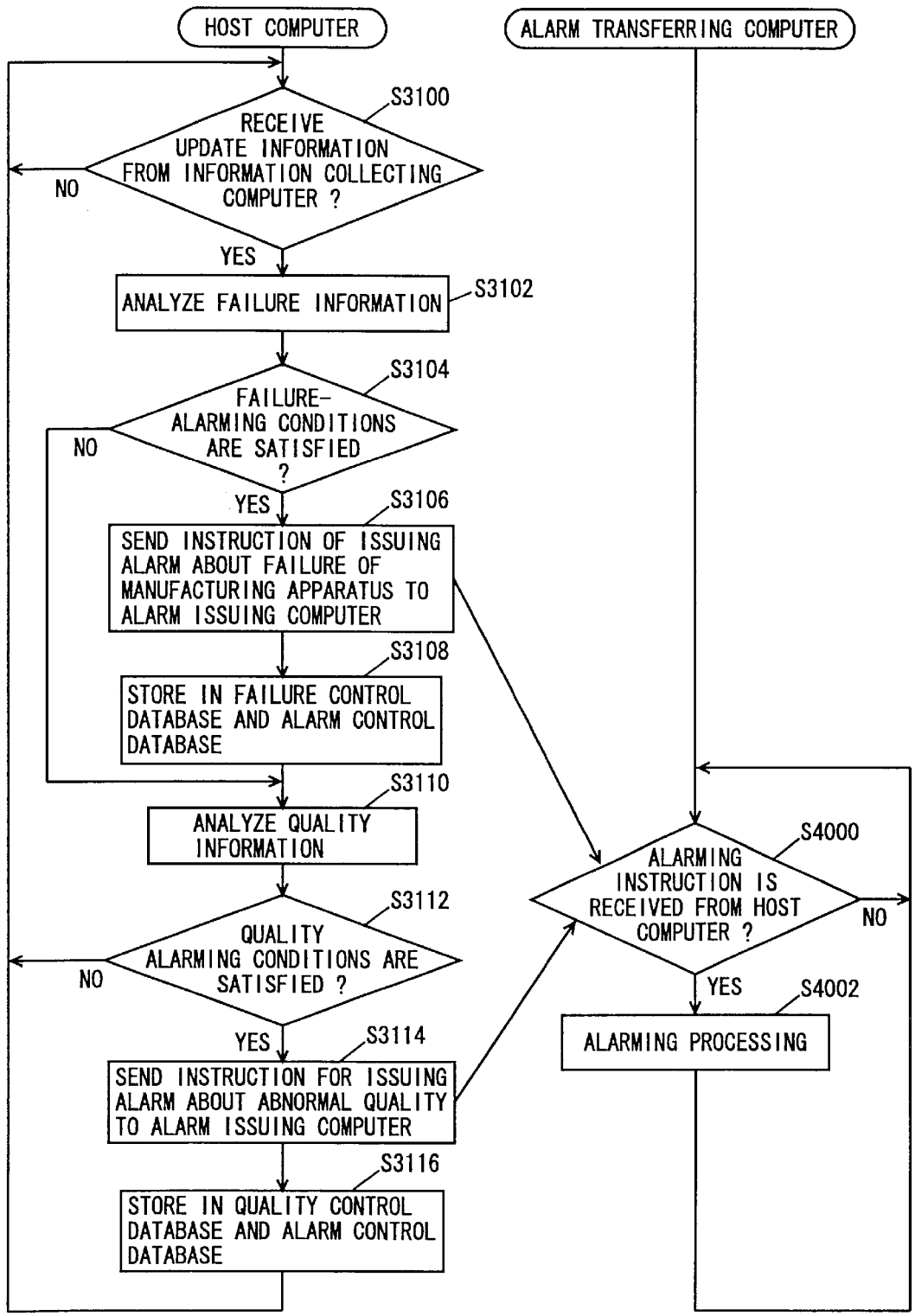
FIG. 23 is a flowchart illustrating procedures of control of alarming processing in the facility operation monitoring system.

Referring to FIG. 23, the programs executed by facility operation monitoring host computer 1000 and alarm transferring computer 7000 have the following control structure in connection with the alarm transferring processing.

In a step S3100, CPU 1002 of facility operation monitoring host computer 1000 determines whether the update information is received from information collecting computer 6000 or not. If the update information is received from information collecting computer 6000 (YES in step S3100), the processing moves to a step S3102. If not (NO in step S3100), the processing returns to step S3100.

In step S3102, CPU 1002 analyzes the failure information.

In a step S3104, CPU 1002 determines whether conditions for transferring an alarm about the failure are satisfied or not. The alarm transferring conditions are determined based on the degree of importance of failure or the like, and are already stored on fixed disk 1010. If the conditions for transferring an alarm about the failure are satisfied (YES in step S3104), the processing moves to a step S3106. If not (NO in step S3104), the processing moves to a step S3110.

In step S3106, CPU 1002 sends an instruction for transferring the alarm about occurrence of a failure in manufacturing apparatus 4200 to alarm transferring computer 7000.

In a step S3108, CPU 1002 stores alarm transferring information in failure control database 1050 and alarm control database 1070.

In a step S3110, CPU 1002 analyzes the quality information. In a step S3112, CPU 1002 determines whether alarm transferring conditions relating to the quality are satisfied or not. If the alarm transferring conditions relating to the quality are satisfied (YES in step S3112), the processing moves to a step S3114. If not (NO in step S3112), the processing returns to step S3100.

In step S3114, CPU 1002 sends an instruction for transferring an alarm about abnormal quality to alarm transferring computer 7000.

In step S3116, CPU 1002 stores the quality information in quality control database 1040 and alarm control database 1070.

In a step S4000, alarm transferring computer 7000 determines whether an alarm transferring instruction is received from facility operation monitoring host computer 1000 or not. When the alarm transferring instruction is received from facility operation monitoring host computer 1000 (YES in step S4000), the processing moves to a step S4002. If not (NO in step S4000), the processing returns to step S4000 for waiting for the next alarm transferring instruction.

In step S4002, alarm transferring computer 7000 performs the alarm transferring processing. This processing in step S4002 is performed such that alarm transferring computer 7000 uses PBX connection line 9000 to request PBX 8000 to send the alarm transferring information.

Figure 24:
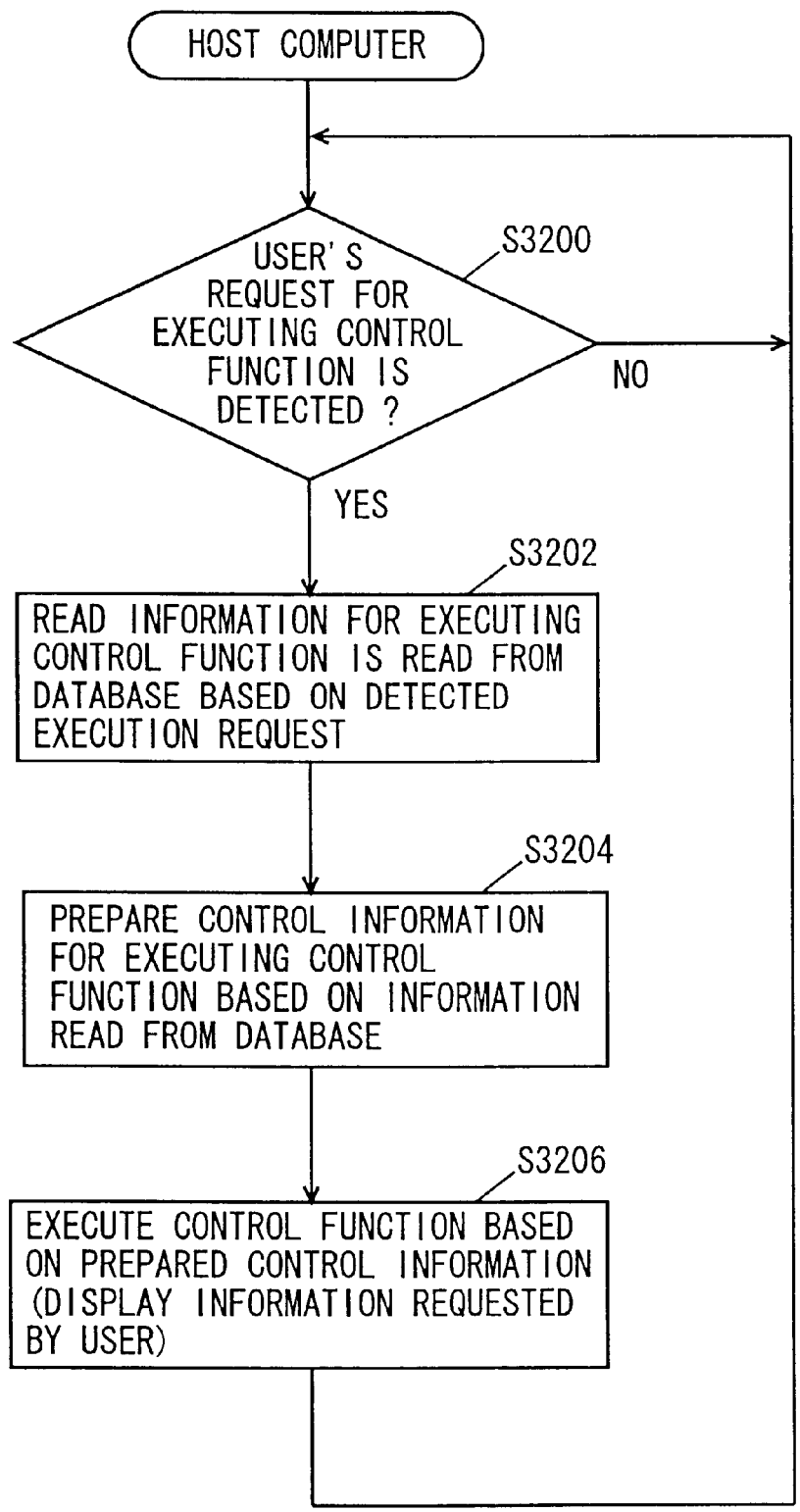
FIG. 24 is a flowchart illustrating procedures of control of control information display processing by a host computer in the facility operation monitoring system.

Referring to FIG. 24, the program executed by facility operation monitoring host computer 1000 has the following control structure in connection with the control processing.

In a step S3200, CPU 1002 of facility operation monitoring host computer 1000 determines whether a user's request for executing the control function is detected or not. If the user's request for executing the control function is detected (YES in step S3200), the processing moves to a step S3202. If not (NO in step S3200), the processing returns to step S3200.

In step S3202, CPU 1002 reads out the information for executing the control function from the database in response to the detected execution request. In step S3204, CPU 1002 prepares control information for executing the control function based on the information read from the database.

In a step S3206, CPU 1002 executes the control function based on the control information thus prepared. For example, a monitor 1004 displays the required information based on the user's request.

Figure 25:
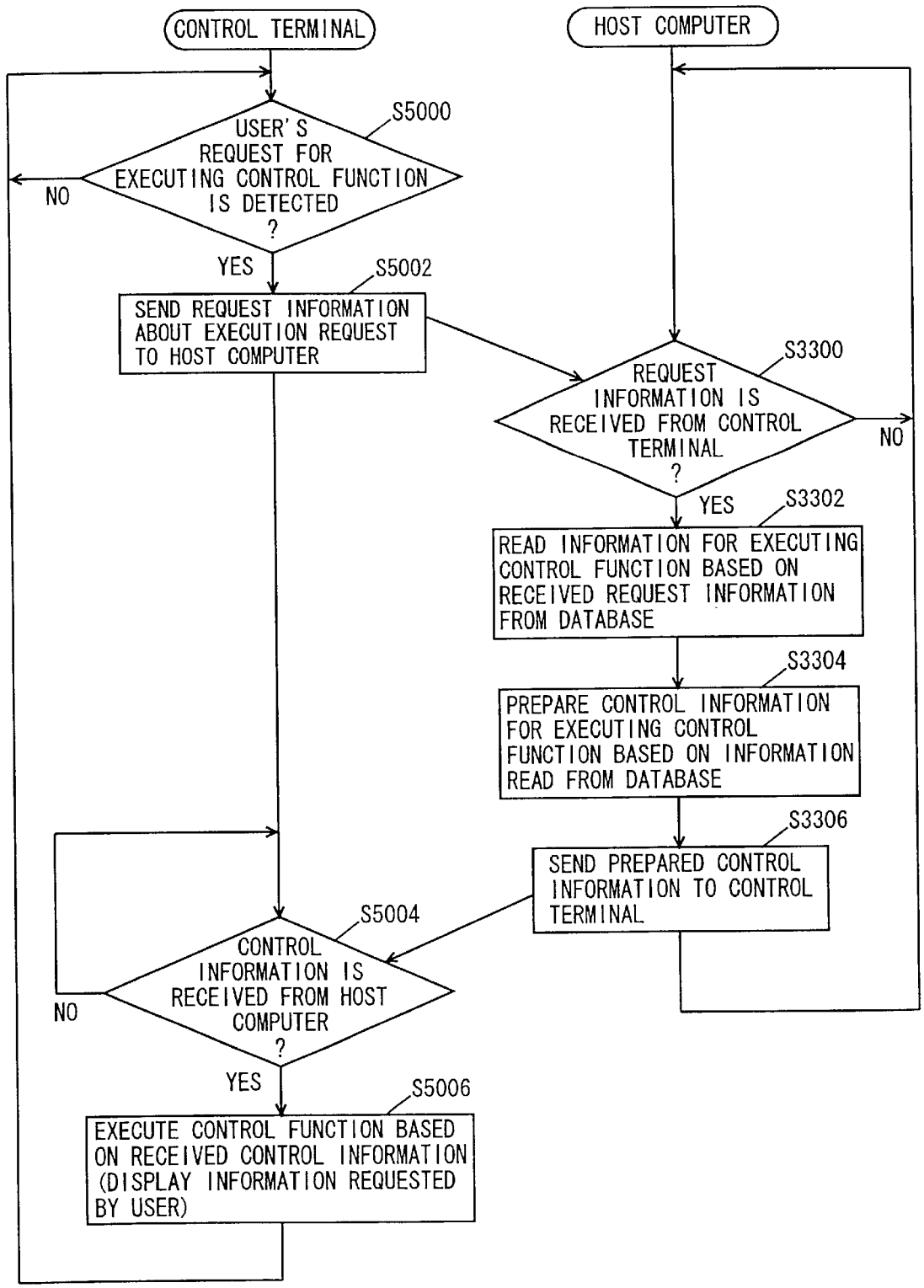
FIG. 25 is a flowchart illustrating procedures of control of control information display processing by a control terminal in the facility operation monitoring system.

Referring to FIG. 25, the program executed by control terminal 5000 and facility operation monitoring host computer 1000 has the following control structure in connection with the control function.

In a step S5000, control terminal 5000 determines whether entry of the user's request for executing the control function is detected or not. If the entry of the user's request for executing the control function is detected (YES in step S5000), the processing moves to a step S5002. If not (NO in step S5000), the processing returns to step S5000.

In step S5002, control terminal 5000 sends request information representing an execution request to facility operation monitoring host computer 1000.

In a step S5004, control terminal 5000 determines whether the control information is received from facility operation monitoring host computer 1000 or not. If the control information is received from facility operation monitoring host computer 1000 (YES in step S5004), the processing moves to a step S5006. If not (NO in step S5004), the processing returns to step S5000.

In step S5006, control terminal 5000 executes the control function based on the received control information. According to the processing in step S5006, for example, the monitor displays the information requested by the user.

In a step S3300, CPU 1002 of facility operation monitoring host computer 1000 determines whether the requested information is received from control terminal 5000 or not. If the requested information is received from control terminal 5000 (YES in step S3300), the processing moves to a step S3302. If not (NO in step S3300), the processing returns to step S3300.

In step S3302, CPU 1002 reads out the information for executing the control function from the database based on the requested information received thereby. In a step S3304, CPU 1002 prepares the control information for executing the control function by control terminal 5000 based on the information read from the database.

In a step S3306, facility operation monitoring host computer 1000 sends the prepared control information to control terminal 5000. Thereafter, the processing returns to step S3300.

Figure 26:
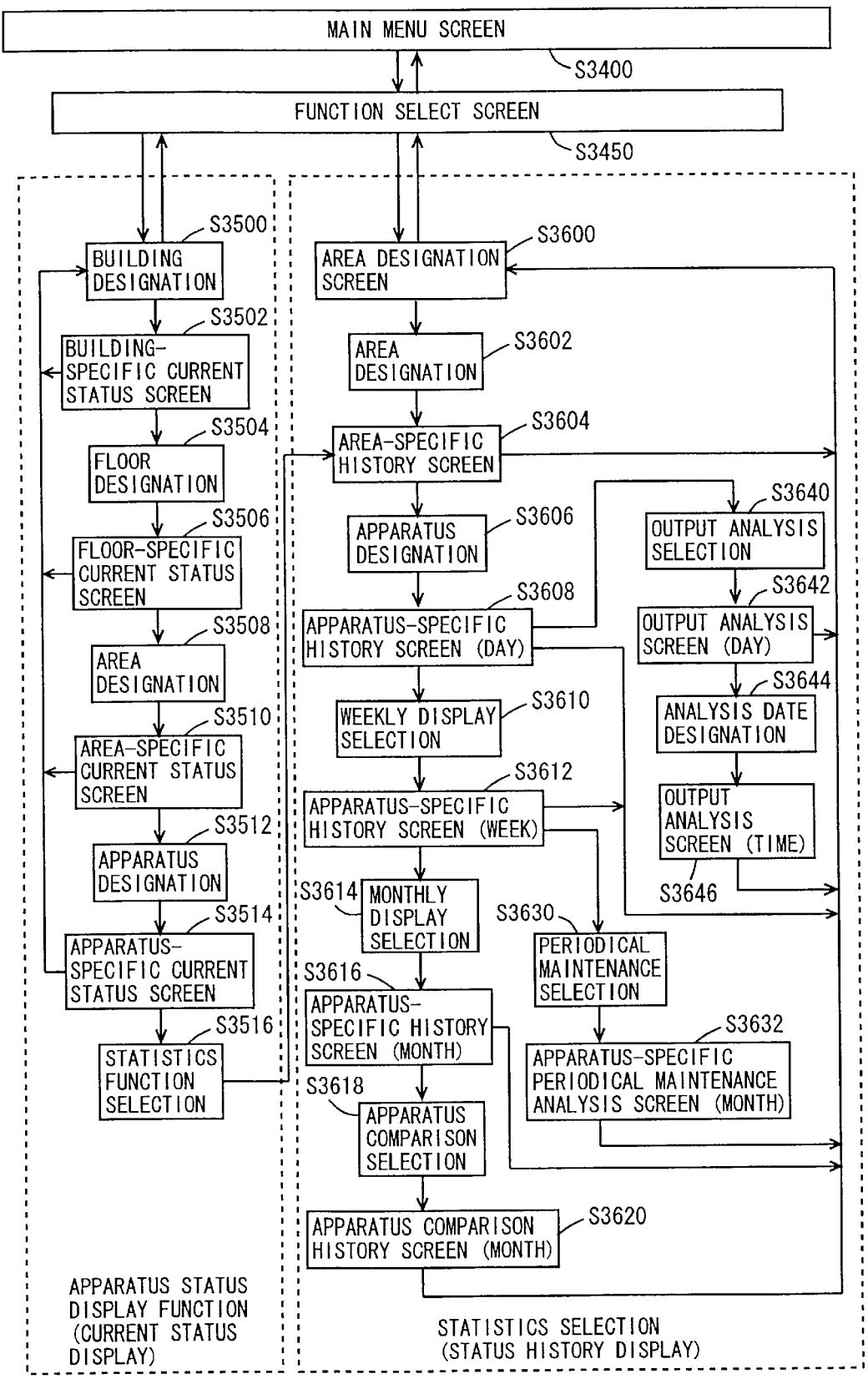
FIGS. 26 and 27 are flowcharts illustrating changes of screen contents displayed on a monitor in the facility operation monitoring system.

Referring to FIG. 26, description will now be given on changes of the screen contents, which are performed in step S3206 illustrated in FIG. 24 and step S5006 illustrated in FIG. 25. FIG. 26 illustrates an apparatus status display function and a statistical function in the facility operation monitoring system.

In a step S3400, a main menu screen appears. In a step S3450, a function select screen appears. On this function select screen, the user selects one function from the apparatus status display function, statistical function, periodical maintenance control function and failure control function. By selecting the apparatus status display function and then designating a building in a step S3500, the current status relating to the designated building is displayed on the screen in a step S3502. When the floor is designated in a step S3504, the current status relating to the designated floor is displayed on the screen in a step S3506. When the area is designated in a step S3508, the current status relating to the designated area is displayed on the screen in a step S3510. When the apparatus is designated in a step S3512, the current status relating to the designated apparatus is displayed on the screen in a step S3514. When the statistical function is selected in a step S3516, an area-specific history screen appears in a step S3604.

When the statistical function is selected, an area designation screen appears in a step S3600. When the area is designated in a step S3602, a history display screen relating to the designated area appears in a step S3604. When the apparatus is designated in a step S3606, a history display screen (day) relating to the designated apparatus appears in a step S3608. When the display on a weekly basis is requested in a step S3610, an apparatus-specific history display screen (week) appears in a step S3612.

When the display on a monthly basis is requested in a step S3614, an apparatus-specific history display screen (month) appears in a step S3616. When apparatus comparison is requested in a step S3618, an apparatus comparison history display screen (month) appears in a step S3620. When a periodical maintenance analysis is requested in a step S3630, an apparatus-specific periodical maintenance analysis screen (month) appears in a step S3632. When an product output analysis is requested in a step S3640, an output analysis display screen (day) appears in a step S3642. When the analysis date is designated in a step S3644, the output analysis screen (time) appears in a step S3646.

It is possible to return to the screen in step S3500 for designating the building from the screens in steps S3502, S3506, S3510 and S3514 relating to the apparatus status display function. Likewise, It is possible to return to the screen in step S3600 for designating the area from the screens in steps S3604, S3608, S3612, S3616, S3632, S3642 and S3646 relating to the statistical function.

Figure 27:
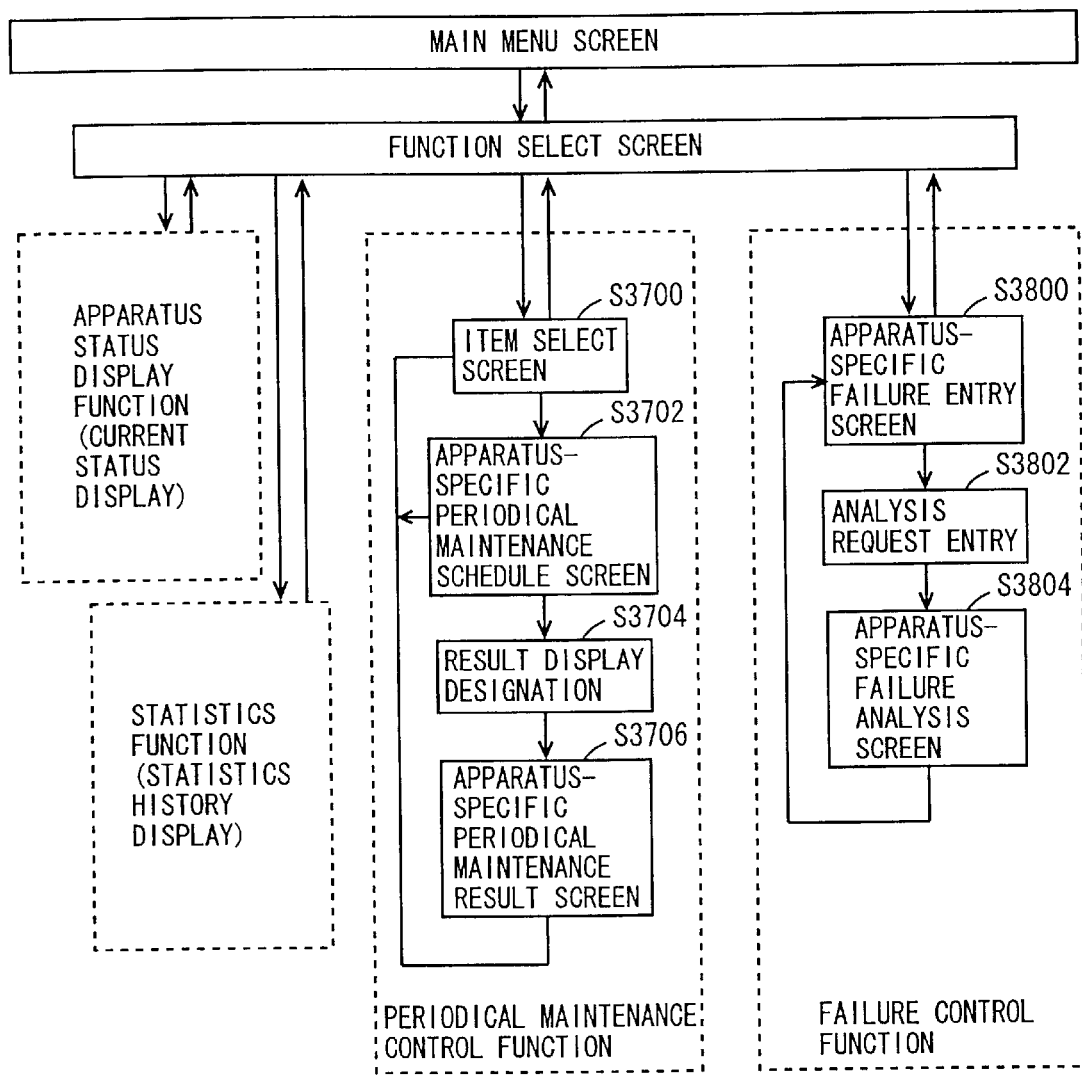

Referring to FIG. 27, the screen contents change as described below when the user selects the periodical maintenance control function or the failure control function on the function select menu. In a step S3700, an item select menu is displayed on the screen. In a step S3702, an apparatus-specific periodical maintenance schedule is displayed on the screen. When display of results is designated in a step S3704, apparatus-specific periodical maintenance results are displayed on the screen in a step S3706.

When the user select the failure control function on the function select screen, the apparatus-specific failure entry screen appears in a step S3800. When analysis request is done in a step S3802, an apparatus-specific failure analysis is displayed on the screen in a step S3804.

It is possible to return to the screen for the item selection in step S3700 from the screens in steps S3702 and 3706 relating to the periodical maintenance control function. Likewise, it is possible to return from the screen relating to the failure control function in step S3804 to the apparatus-specific failure entry screen in step S3800.

Based on the structures and flowcharts already described, the facility operation monitoring system according to the embodiment operates as follows.

When the controller of manufacturing apparatus 4200 detects the arrival of the status sending time (YES in step S1000), the controller of manufacturing apparatus 4200 sends the status information to FA computer 4100 (S1002). When the controller of manufacturing apparatus 4200 detects occurrence of a failure (YES in step S1004), the failure information is sent to FA computer 4100 (S1006).

When the controller of manufacturing apparatus 4200 detects the input of the maintenance information (YES in step S1008), the maintenance information is sent to FA computer 4100 (S1010). When the controller of manufacturing apparatus 4200 detects the input of the quality information (YES in step S1012), the controller of manufacturing apparatus 4200 sends the quality trouble information to FA computer 4100 (S1014).

When the controller of manufacturing apparatus 4200 detects the occurrence of an abnormality in the communication circuit or the like (YES in step S1100), the operation of the communication circuit stops (S1106). When the communication inquiry time arrives (YES in step S2000), FA computer 4100 sends the communication function inquiry data to the controller of manufacturing apparatus 4200 (S2202). If the controller of manufacturing apparatus 4200 keeps the communication circuit in the off state (S1106), the ACK signal cannot be sent to FA computer 4100 in response to the reception of the communication function inquiry data. Therefore, FA computer 4100 waits for reception of the ACK signal (S2004), but cannot receive the ACK signal even when a predetermined time elapses (YES in step S2006). If the ACK signal cannot be received even after the above processing is repeated for predetermined times, FA computer 4100 prepares the failure information relating to the communication circuits for connection to manufacturing apparatus 4200 (S2010).

When FA computer 4100 receives the status information from the controller of manufacturing apparatus 4200 (YES in step S2100), it sends the status information to information collecting computer 6000 (S2102). When FA computer 4100 receives the failure information from the controller of manufacturing apparatus 4200 (YES in step S2104), it sends the failure information to information collecting computer 6000 (S2106). When FA computer 4100 receives the maintenance information from the controller of manufacturing apparatus 4200 (YES in step S2100), it sends the maintenance information to information collecting computer 6000 (S2110). FA computer 4100 receives the quality information from the controller of manufacturing apparatus 4200 (YES in step S2112). If the received quality information does not fall within the normal range, FA computer 4100 sends the quality trouble information to information collecting computer 6000 (S2116).

In response to the processing of FA computer 4100 in steps S2102, S2106, S2110 and S2116, the information collecting computer 6000 detects the reception of information from FA computer 4100 (YES in step S3000). Information collecting computer 6000 stores the information received from FA computer 4100 in a predetermined database (S3002). When information collecting computer 6000 determines that the time for sending to facility operation monitoring host computer 1000 has arrived (YES in step S3004), it sends the update information of the database to the controller of manufacturing apparatus 4200 (S3006).

When facility operation monitoring host computer 1000 receives the update information from information collecting computer 6000 (YES in step S3100), it analyzes the failure information (S3102). If the conditions for transferring the alarm about the failure are satisfied (YES in step S3104), the instruction for transferring the alarm about the failure of manufacturing apparatus 4200 is sent to alarm transferring computer 7000 (S3106).

Facility operation monitoring host computer 1000 analyzes the quality information based on the update information received from information collecting computer 6000 (S3110). If the alarm transferring conditions relating to the quality are satisfied (YES in step S3112), the instruction for transferring the alarm about the abnormality in the quality is sent to alarm transferring computer 7000 (S3114).

In response to the processing by facility operation monitoring host computer 1000 in steps S3106 and S3114, alarm transferring computer 7000 detects that the alarm transferring information is received from facility operation monitoring host computer 1000 (YES in step S4000). Alarm transferring computer 7000 executes the alarm transferring processing by PBX 8000 connected to PBX connection line 9000 (S4002). Alarm transferring computer 7000 may be configured to execute the alarm transferring processing (S4002) in such a case that a throughput in manufacturing apparatus 4200 remarkably lowers, in addition to such cases that a failure occurs in manufacturing apparatus 4200, and that the quality information relating to the products produced by manufacturing apparatus 4200 represents an abnormality.

In facility operation monitoring host computer 1000, when the user requests execution of the control function (YES in step S3200), the information for executing the control function is read from one or some of the databases illustrated in FIGS. 4–19 in response to the detection and the execution request (S3202). The control information for executing the control function is prepared based on the information read from the database (S3204), and the control function is executed based on the control information thus prepared (S3206).

The control function may be achieved only by facility operation monitoring host computer 1000, but may be achieved in such a manner the control information prepared by facility operation monitoring host computer 1000 is sent to control terminal 5000 in response to the request by control terminal 5000, and the control function is achieved by control terminal 5000 based on the received control information.

When control terminal 5000 detects the user's request for executing the control function (YES in step S5000), it sends the request information representing the execution request to facility operation monitoring host computer 1000 (S5002). Facility operation monitoring host computer 1000 receives the request information from control terminal 5000 (YES in step S3300), reads the information for executing the control function based on the received request information from the databases illustrated in FIGS. 4–19 (S3302), prepares the control function for executing the control function based on the read information (S3304), and sends the control information thus prepared to control terminal 5000 (S3306).

When control terminal 5000 receives control information from facility operation monitoring host computer 1000 (YES in step S5004), it executes the control function based on the received control information (S5006).

Referring to FIGS. 28–43, description will now be given on examples of display by facility operation monitoring host computer 1000 and control terminal 5000. After display of the main menu screen (S3400), the function select screen (S3450) is displayed. When the apparatus status display function (current status display function) is selected, and the building is designated (S3500), the building-specific current status screen shown in FIG. 28 appears (S3502). In the example of the screen shown in FIG. 28, the floor can be designated by moving a mouse cursor and clicking an intended floor (S3504) so that an intended floor-specific current status is displayed on the screen (S3506).

Figure 28:
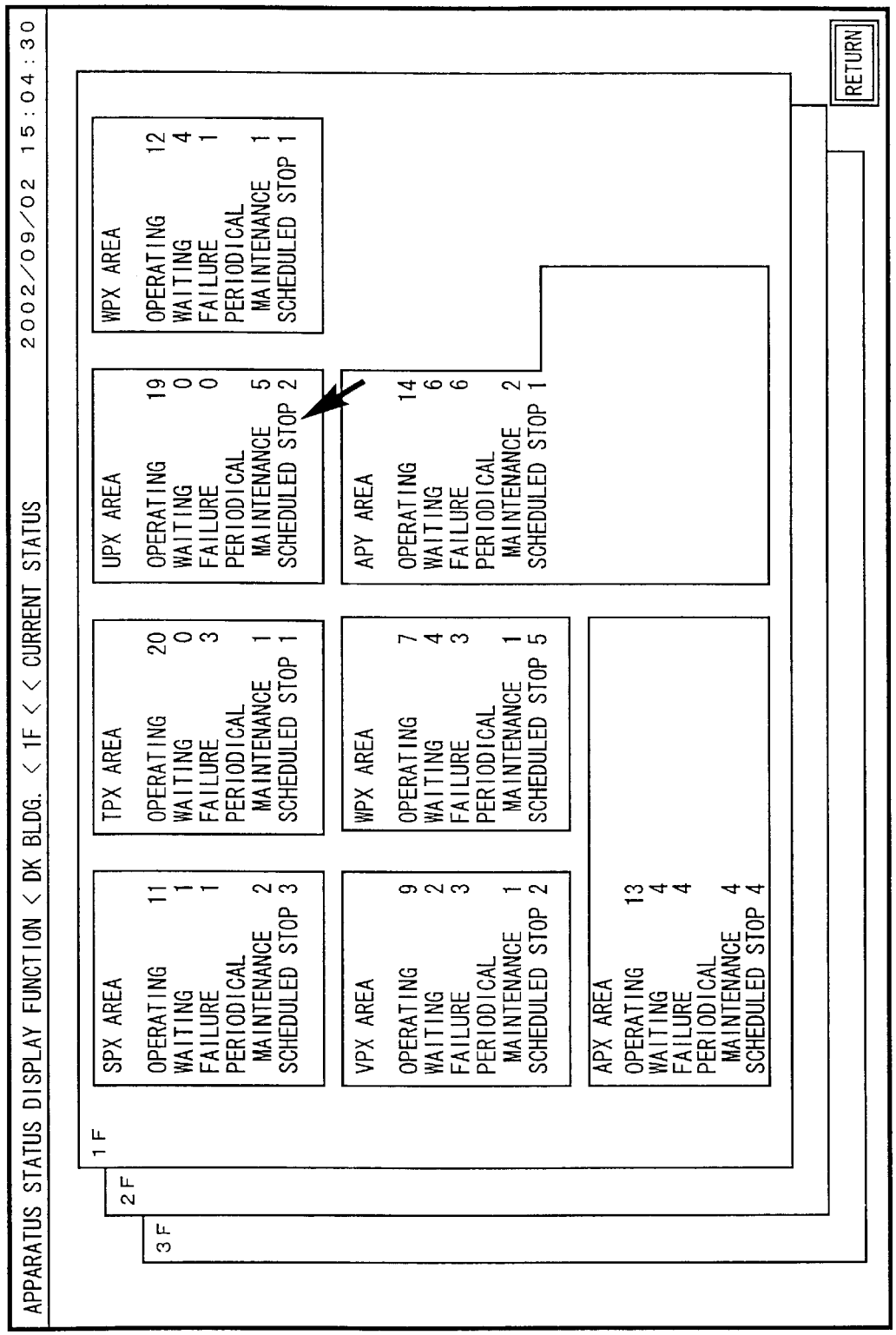
FIG. 28 shows building- and floor-specific current status displayed on a screen of the monitor in the facility operation monitoring system.
Figure 29:
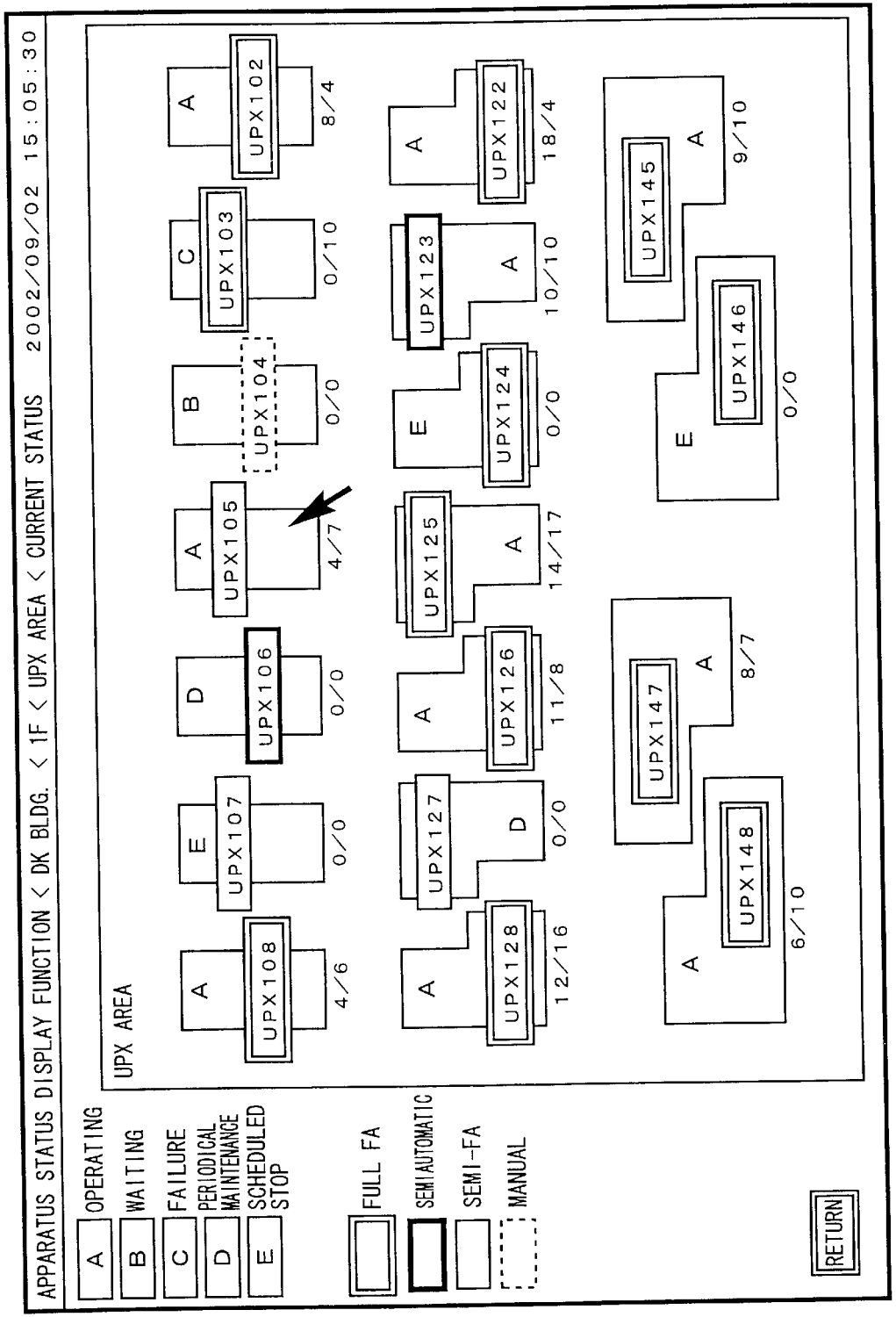
FIG. 29 shows area-specific current statuses displayed on the screen of the monitor in the facility operation monitoring system.

When an area is designed on the example of the screen shown in FIG. 28 (S3508), the area-specific current status display screen appears (S3510). When the apparatus is designated on the area-specific current status display screen shown in FIG. 29 (S3512), the apparatus-specific current status display screen shown in FIG. 30 appears (S3514). When a "RETURN" button is clicked on the screen shown in FIG. 30, the screen returns to the building-specific designation screen (S3500). When a "STATISTICS FUNCTION" button is clicked, the area-specific history display screen of the statistics function (status history display function) appears as shown in FIG. 31 (S3604).

Figure 32:
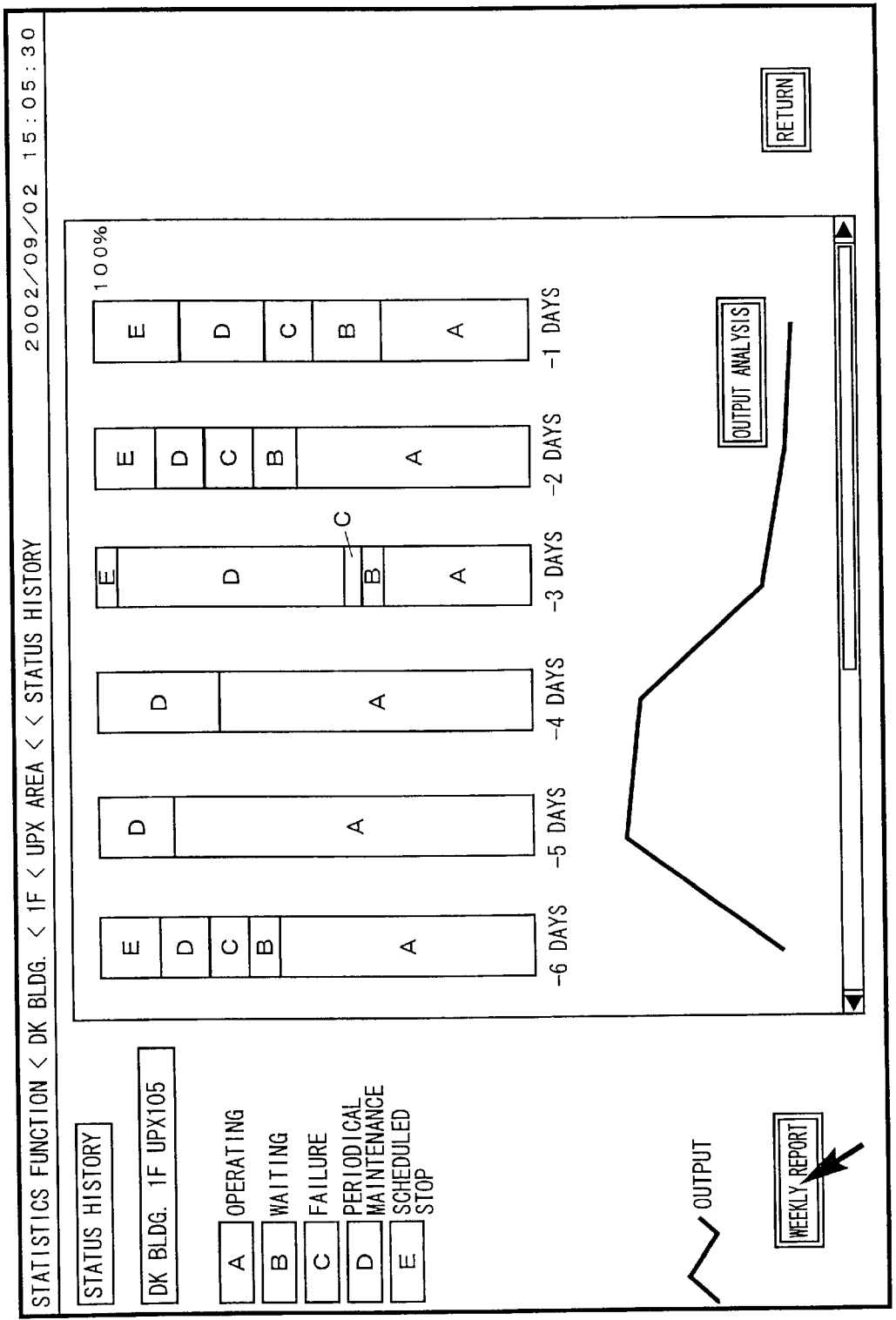
FIG. 32 shows area-specific histories (daily reports) displayed on the screen of the monitor in the facility operation monitoring system.

When the apparatus is designated on the area-specific history display screen shown in FIG. 31 (S3606), the apparatus-specific history display screen (day) shown in FIG. 32 appears (S3608). When an "OUTPUT ANALYSIS" button is clicked on the screen shown in FIG. 32 (S3640), the output analysis screen (day) shown in FIG. 33 appears (S3642). When the analysis date is designated on the screen shown in FIG. 33 (S3644), the output analysis screen (time) shown in FIG. 34 appears (S3646).

Figure 35:
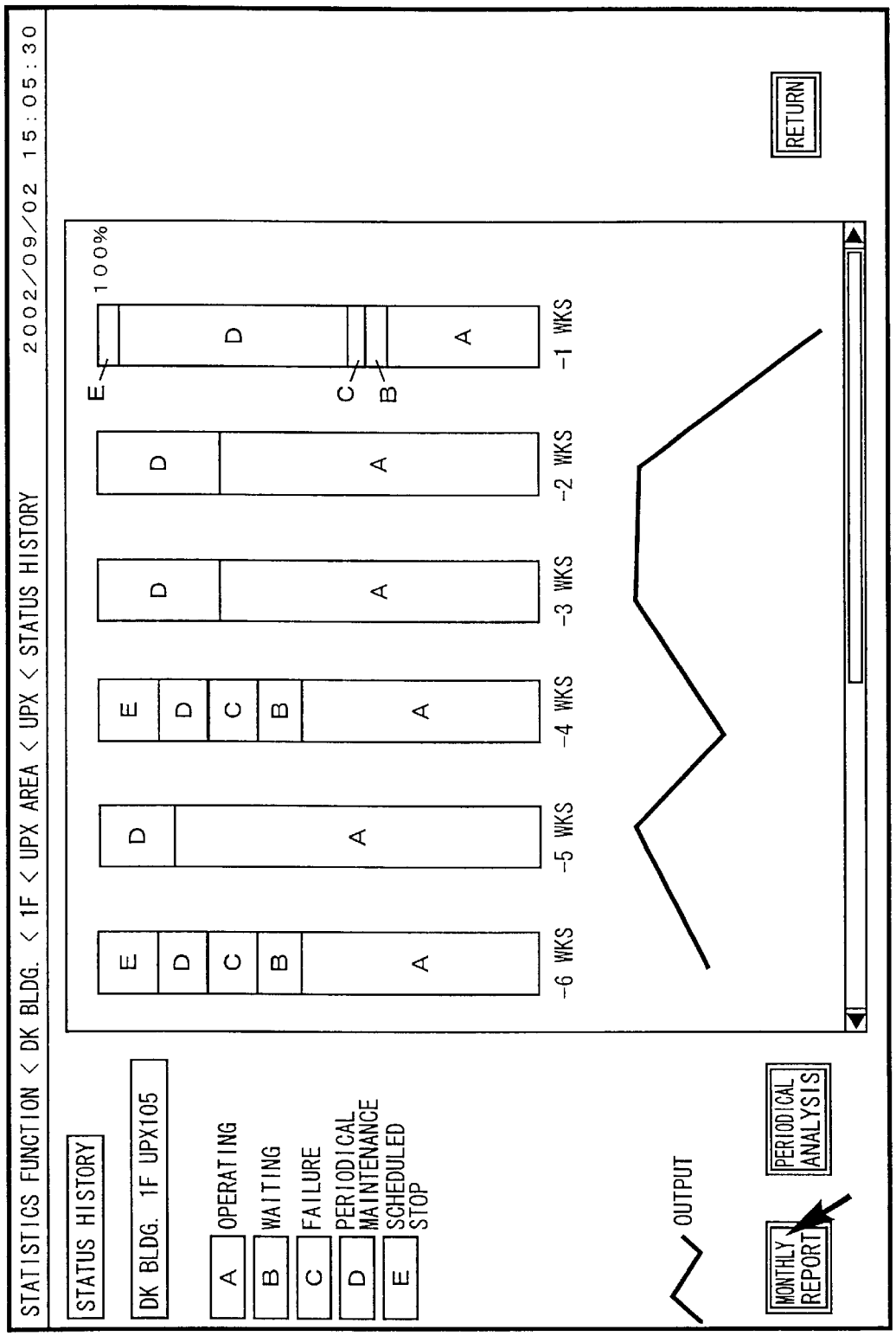
FIG. 35 shows apparatus-specific histories (weekly reports) displayed on the screen of the monitor in the facility operation monitoring system.

When the weekly status display is selected in step S3610 on the apparatus-specific history display screen (day) shown in FIG. 32 (S3608), the apparatus-specific history display screen (week) appears shown in FIG. 35 (S3612). When the monthly display is selected on the screen shown in FIG. 35 (S3614), the apparatus-specific history display screen (month) appears as shown in FIG. 36 (S3616).

Figure 37:
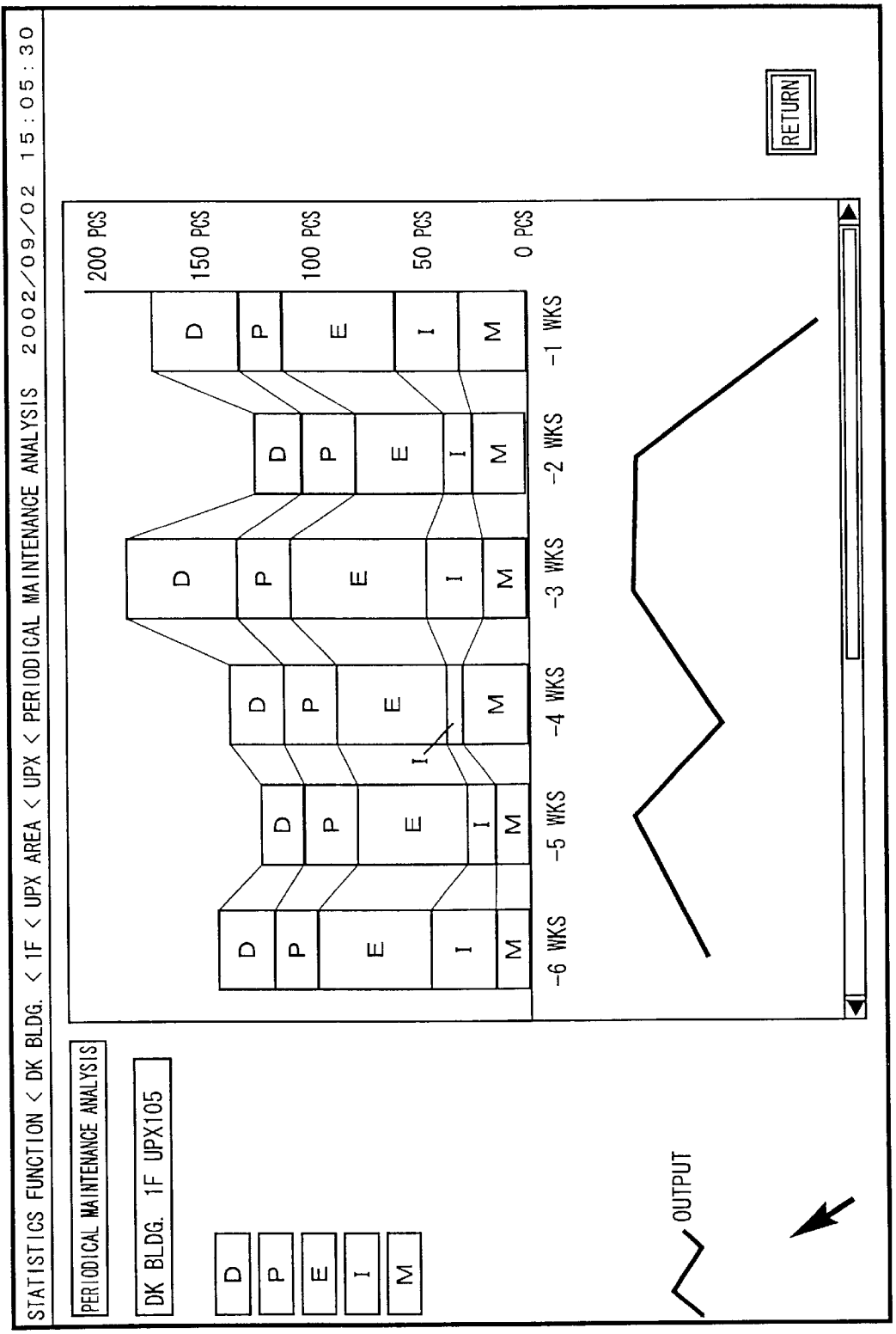
FIG. 37 shows a periodical maintenance analysis displayed on the screen of the monitor in the facility operation monitoring system.

When a "SCHEDULED MAINTENANCE ANALYSIS" button is clicked in step S3630 on the apparatus-specific history display screen (week) shown in FIG. 36, the apparatus-specific scheduled maintenance analysis display screen (month) appears as shown in FIG. 37 (S3632).

When the apparatus comparison is selected in step S3618 on the apparatus-specific history display screen (month) shown in FIG. 36 (S3616), the apparatus-specific history display screen (month) appears as shown in FIG. 38 (S3620).

Figure 39:
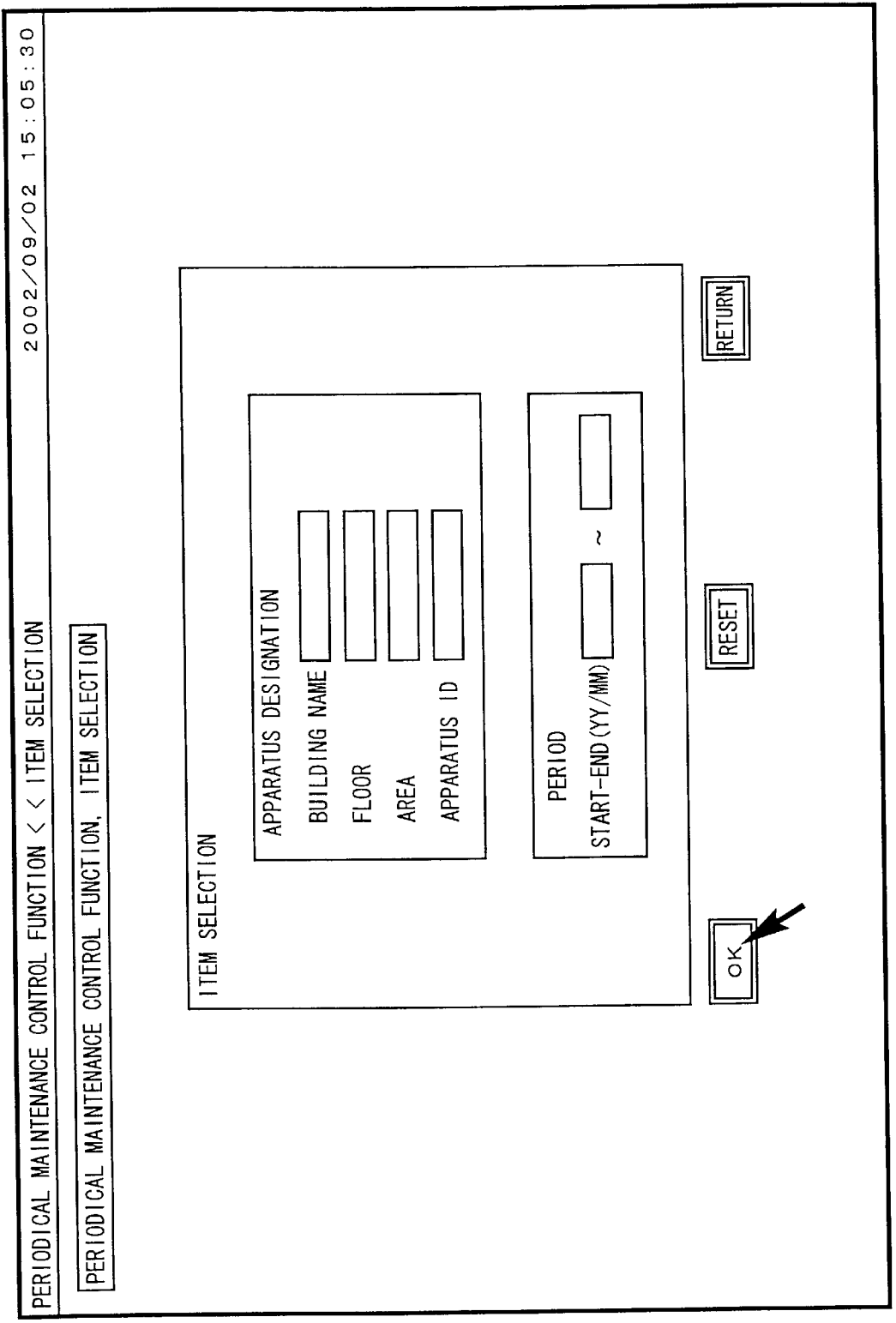
FIG. 39 shows an item selection screen of the monitor in the facility operation monitoring system.

When the scheduled maintenance control function is selected on the function select screen, the item selecting screen appears as shown in FIG. 39 (S3700). When the item is selected, the apparatus-specific maintenance schedule screen appears as shown in FIG. 40 (S3702). When the result display is selected in step S3704 on the apparatus-specific maintenance schedule screen (S3702) shown in FIG. 40, the apparatus-specific scheduled maintenance result screen appears as shown in FIG. 41 (S3706).

When the failure control function is selected on the function select screen, the apparatus-specific failure entry screen appears as shown in FIG. 42 (S3800). When the analysis request is made in step S3802 on the apparatus-specific failure entry screen (S3800) shown in FIG. 42, the apparatus-specific failure analysis display screen appears as shown in FIG. 43 (S3804).

Figure 33:
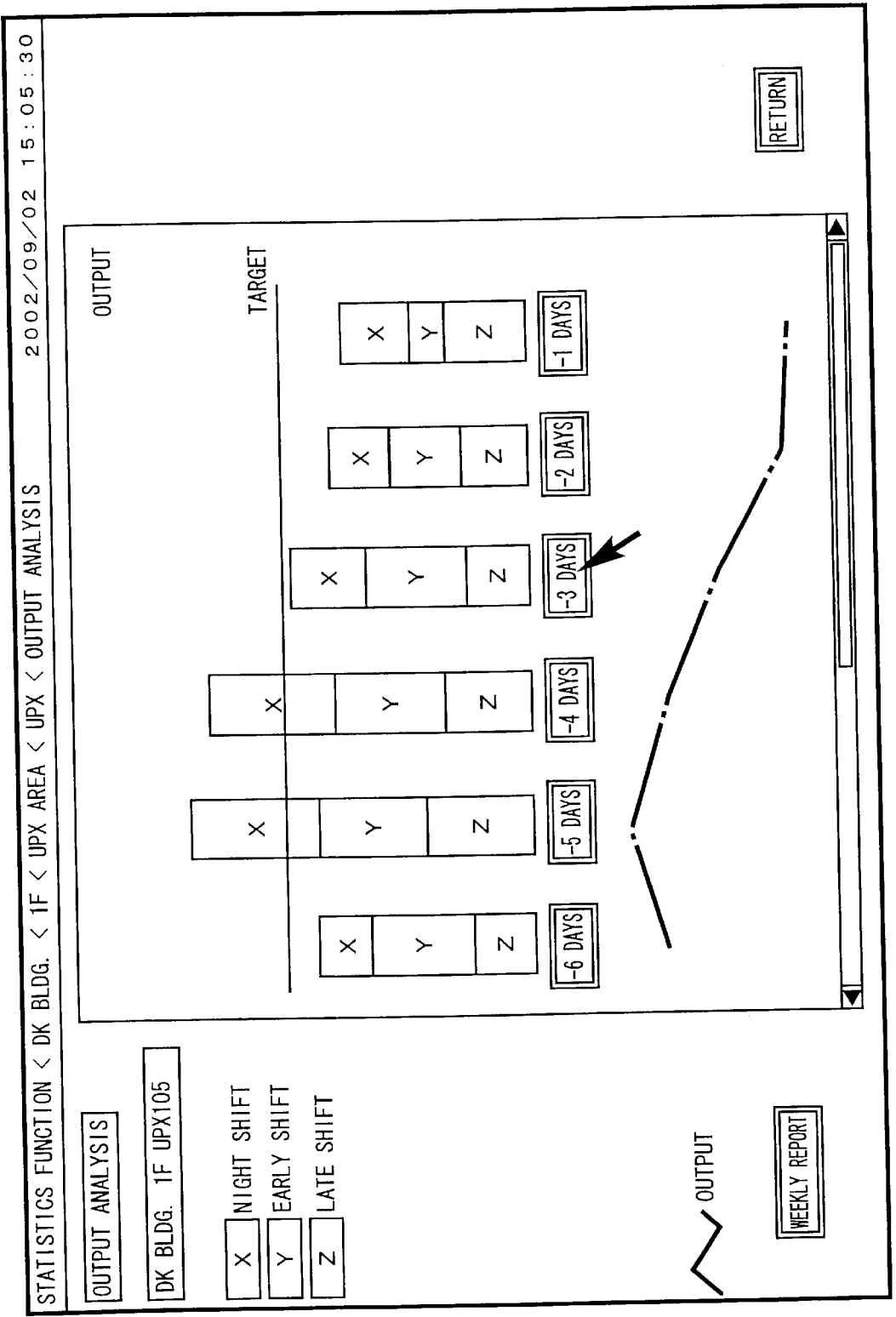
FIG. 33 shows an output analysis (daily reports) displayed on the screen of the monitor in the facility operation monitoring system.
Figure 34:
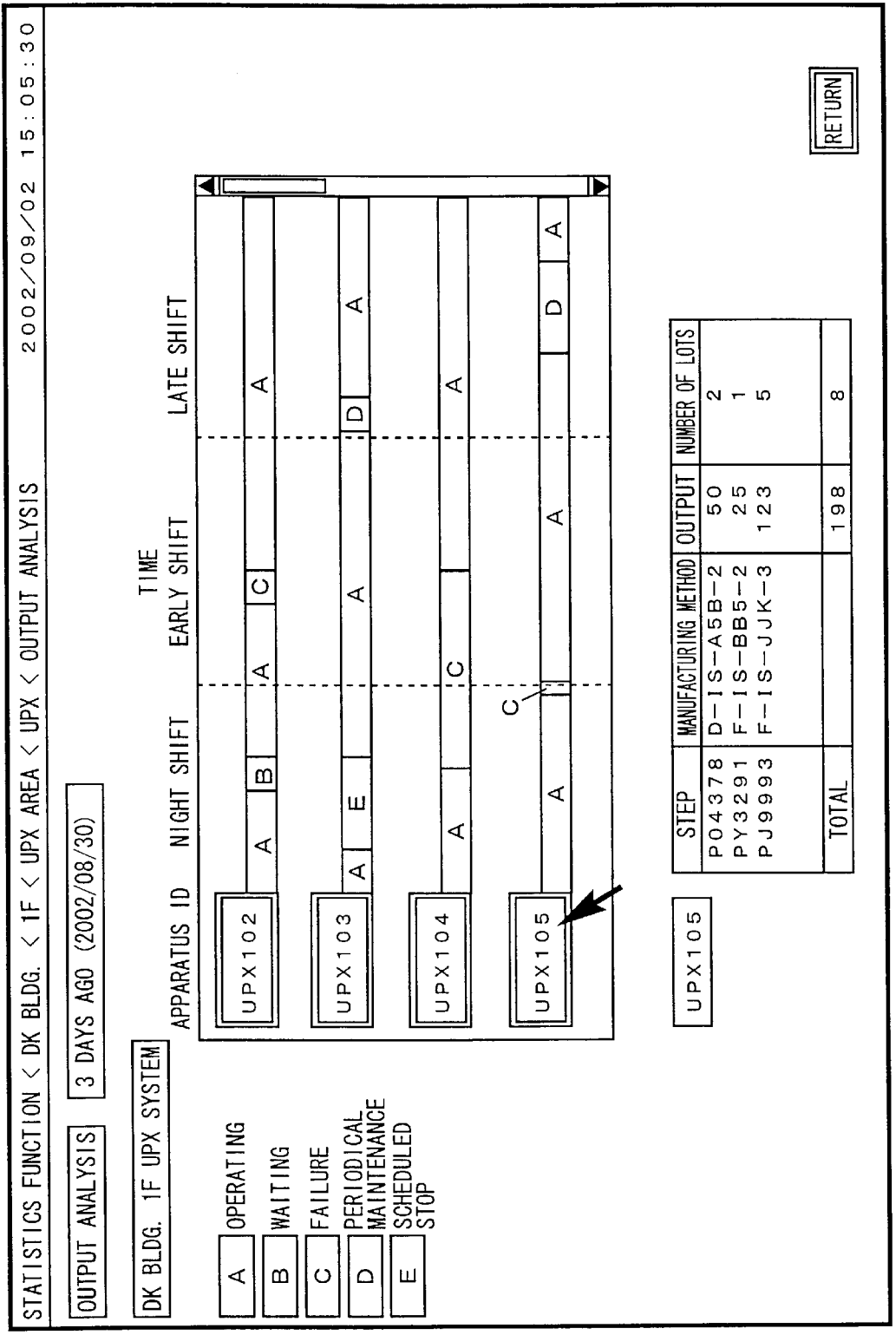
FIG. 34 shows an output analysis (time reports) displayed on the screen of the monitor in the facility operation monitoring system.

On these screens, as shown in FIGS. 29, 31, 32 and 34–38, the statuses ("operating", "waiting", "failure", "scheduled maintenance" and "scheduled stop") of the manufacturing apparatus as well as the functions ("full FA", "semiautomatic", "semi-FA" and "manual") of the manufacturing apparatus are displayed in a manner, which allows easy and quick visual recognition by the supervisor or operator. Further, as shown in FIG. 33, the shifts ("night shift", "early shift" and "late shift") are likewise displayed in a manner allowing easy and quick visual recognition by the supervisor or operator.

According to the facility operation monitoring system of the embodiment, the facility operation monitoring host computer obtains, for example, the operation information, output information and quality information from the manufacturing apparatus of semiconductor chips via the FA computer and the information collecting computer in the foregoing manner. The facility operation monitoring host computer stores the information received from the information collecting computer in the various databases, and instructs the alarm transferring computer to transfer the alarm information, when necessary. With the facility operation monitoring host computer and the control terminal, the supervisor can execute the status display function, statistics function, periodical maintenance control function and failure control function of the apparatus. When such functions are executed, the information is displayed in a manner compiled or integrated by the location of the manufacturing apparatus and the predetermined time range. Links are established between the displayed items of information so that the screen can be easily switched. This allows easy and accurate monitoring of the manufacturing apparatuses in the manufacturing process, which is formed of the many manufacturing apparatuses, and the products produced by the manufacturing apparatuses.

According to the invention, each manufacturing apparatus sends to this system the information representing the throughput of the manufacturing apparatus and the information representing the quality of the products produced by the manufacturing apparatus. The information thus sent is collected by collecting means, and is stored in first storing means. First preparing means prepares first information representing the throughput, which is an example of the results of the manufacturing by each manufacturing apparatus. Second preparing means prepares second information representing changes in throughput with time. Output means outputs first and second information in a manner linking such information with each other. For example, the throughput of each manufacturing apparatus and changes in such throughput with time are displayed in a manner linking them with each other. First transferring means transfers alarm information based on either the first or the second information. For example, if the throughput lowers substantially below a predetermined threshold, or a low throughput continues for a predetermined period, the alarm information is transferred. Owing to the above operations, the supervisor receiving the alarm from the system can view the first information provided by the output means as well as the second information displayed in a manner linked with the first information. Since different items of information, which are strongly related to each other, are output in a manner linking them with each other, the supervisor can easily recognize the current state of the manufacturing apparatus. Consequently, it is possible to provide the manufacturing line monitoring system, which can easily and appropriately execute monitoring of the large number of manufacturing apparatuses in the manufacturing process formed of the manufacturing apparatuses as well as the products. manufactured by the manufacturing apparatuses.

According to the invention, the system further prepares third information relating to a difference in first information (e.g., throughput), which relates to the results of manufacturing by each manufacturing apparatus, between the manufacturing apparatuses. This third information is output in a manner linking the first and second information with each other. Thereby, the supervisor can easily and accurately recognize the difference in throughput between the manufacturing apparatuses executing the same processing.

Further, according to the invention, the maintenance plan (scheduled date of the maintenance) of the manufacturing apparatus is stored, and the results of maintenance (date of executed maintenance) are prepared. The second output means outputs these maintenance plan and the results of maintenance in a manner linking them with each other. Thereby, the supervisor can quickly determine whether the maintenance is already executed or not, and when the maintenance will be executed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing line monitoring system for monitoring a manufacturing line including a plurality of manufacturing apparatuses, the monitoring system comprising:
   collecting means for collecting information from each of the manufacturing apparatuses;
   first storage means for storing the information collected;
   first preparing means for preparing first information relating to results of manufacturing by each of the manufacturing apparatuses, based on the information stored;
   second preparing means for preparing second information relating to variations in the results of manufacturing, based on the first information;
   current operation information preparing means for preparing current operation information relating to current operation of each of the manufacturing apparatuses;
   first output means for outputting the first information, the second information, the current operation information linking the first information, the second information, and the current operation information with each other; and
   first transferring means for transferring first alarm information based on one of the first information, the second information, and the current operation information, said first output means including means for outputting the first information, the second information, and the current operation information by changing one of color, shape, and pattern to make the first information, the second information, and the current operation information visually recognizable by a user, wherein
      said first information includes rate of operation and output of products for at least one of said manufacturing apparatuses,
      said second information is operation history for at least one of said manufacturing apparatuses, and
      said current operation information is current operation status for at least one of said manufacturing apparatuses.

2. The manufacturing line monitoring system according to claim 1, further comprising third preparing means for preparing third information relating to differences in results between the manufacturing apparatuses based on the first information, wherein the first output means includes means for outputting the first information, the second information, the third information, and the current operation information linking the first information, the second information, the third information, and the current operation information with each other.

3. The manufacturing line monitoring system according to claim 1, wherein said first output means includes means for outputting information in accordance with predetermined intervals.

4. The manufacturing line monitoring system according to claim 3, wherein the predetermined interval is determined in one of seconds, minutes, hours, days, weeks, or months.

5. The manufacturing line monitoring system according to claim 1, wherein said first output means includes means for outputting information in accordance with predetermined conditions relating to a location of each of the manufacturing apparatuses.

6. The manufacturing line monitoring system according to claim 5, wherein the predetermined conditions are that the manufacturing apparatuses are in the same building, that the manufacturing apparatuses are on the same floor, or that the manufacturing apparatuses are in the same area.

7. The manufacturing line monitoring system according to claim 1, wherein the information includes information relating to a current operation status of each of the manufacturing apparatuses.

8. The manufacturing line monitoring system according to claim 7, wherein said first transferring means includes means for transferring the alarm information when the current operation status satisfies predetermined conditions.

9. The manufacturing line monitoring system according to claim 8, wherein the predetermined conditions are that the current operation status is a fault status.

10. The manufacturing line monitoring system according to claim 1, wherein the information includes information relating to throughput of each of the manufacturing apparatuses.

11. The manufacturing line monitoring system according to claim 10, wherein said first transferring means includes means for transferring the first alarm information when the throughput satisfies predetermined conditions.

12. The manufacturing line monitoring system according to claim 11, wherein the predetermined conditions are that the throughput is lower than a predetermined threshold.

13. The manufacturing line monitoring system according to claim 1, wherein the information includes information relating to quality of product produced by each of the manufacturing apparatuses.

14. The manufacturing line monitoring system according to claim 13, wherein said first transferring means includes means for transferring the first alarm information when the quality of the product satisfies predetermined conditions.

15. The manufacturing line monitoring system according to claim 14, wherein the predetermined conditions are that the quality of the product matches a predetermined quality for rejection.

16. The manufacturing line monitoring system according to claim 1, further comprising:
   second storage means for storing maintenance schedule information relating to a maintenance schedule of each of the manufacturing apparatuses;
   third preparing means for preparing third information relating to results of maintenance of each of the manufacturing apparatuses based on the information stored; and
   second output means for outputting the maintenance schedule information and the third information linking the maintenance schedule information and the third information with each other.

17. The manufacturing line monitoring system according to claim 16, further comprising second transferring means for transferring second alarm information prepared by a comparison between the maintenance schedule information and the third information.

18. The manufacturing line monitoring system according to claim 17, wherein the second alarm information relates to the maintenance schedule not matching the results of the maintenance.

19. The manufacturing line monitoring system according to claim 1, wherein said first transferring means includes means for transferring the first alarm information on a public circuit network.

20. The manufacturing line monitoring system according to claim 19, wherein said first transferring means includes means for transferring the first alarm information to a wireless communication terminal.

* * * * *